United States Patent [19]
Murakami et al.

[11] Patent Number: 5,623,154
[45] Date of Patent: Apr. 22, 1997

[54] SEMICONDUCTOR DEVICE HAVING TRIPLE DIFFUSION

[75] Inventors: Takaaki Murakami; Kenji Yasumura; Shigeru Shiratake, all of Hyogo, Japan

[73] Assignee: Mitsubishi Denki Kabushiki Kaisha, Tokyo, Japan

[21] Appl. No.: 477,697

[22] Filed: Jun. 7, 1995

[30] Foreign Application Priority Data

Oct. 25, 1994 [JP] Japan ..................................... 6-260400

[51] Int. Cl.$^6$ ................................................. H01L 29/76
[52] U.S. Cl. .......................... 257/345; 257/336; 257/344; 257/408
[58] Field of Search ................................. 257/344.5, 336, 257/408

[56] References Cited

U.S. PATENT DOCUMENTS

| 4,649,629 | 3/1987 | Miller et al. | 257/344 |
| 5,359,221 | 10/1994 | Miyamoto et al. | 257/345 |
| 5,449,937 | 9/1995 | Arimura et al. | 257/344 |
| 5,466,957 | 11/1995 | Yuki et al. | 257/344 |

FOREIGN PATENT DOCUMENTS

| 63-300567 | 12/1988 | Japan | 257/345 |
| 1-220858 | 9/1989 | Japan | |
| 2-27760 | 1/1990 | Japan | |
| 2-133929 | 5/1990 | Japan | |
| 3-99430 | 4/1991 | Japan | |
| 4-196341 | 7/1992 | Japan | |
| 5-335568 | 12/1993 | Japan | 257/344 |

OTHER PUBLICATIONS

"MOS Field Effect Transistor" edited by TAkuo Sugano, et al., Nikkan Kogyo.
"Surface Effects on p–n Junctions: Characteristics of Surface Space–Charge Regions Under Non-Equilibrium Conditions", A.S. Grove et al., Solid–State Electronics Pergamon Press 1966, vol. 9.

Primary Examiner—Mahshid D. Saadat
Assistant Examiner—T. M. Arroyo
Attorney, Agent, or Firm—Lowe, Price, LeBlanc & Becker

[57] ABSTRACT

An isolating/insulating film is formed on the surface of a $p^-$ silicon substrate in an element isolating region. An nMOS transistor having a pair of n-type source/drain regions is formed within an element forming region isolated by the isolating oxide film. A $p^+$ impurity diffusion region is formed on the $p^-$ silicon substrate in such a manner as to be contacted with the lower surface of the isolating oxide film in the element isolating region and to extend at a specified depth from the surface of the $p^-$ silicon substrate in the element forming region. A p-type impurity diffusion region having a p-type impurity concentration higher than that of the $p^-$ silicon substrate is formed at the side end portion of the isolating oxide film in such a manner as to be contacted with the n-type source/drain region. With this arrangement, it is possible to reduce leakage current caused by the distribution of crystal defects in a depletion layer.

7 Claims, 23 Drawing Sheets

SEMICONDUCTOR DEVICE HAVING TRIPLE DIFFUSION

BACKGROUND OF THE INVENTION

1. Field of the Invention

The present invention relates to a semiconductor device and its fabricating method, and particularly to a semiconductor element isolating structure and its fabricating method.

2. Description of the Background Art

First, the construction of a prior art semiconductor device will be described with reference to the drawings.

FIG. 24 is a schematic sectional view showing the construction of a prior art semiconductor device. Referring to FIG. 24, an isolating oxide film 5 is formed on the surface of a p-type silicon substrate 1 in an element isolating region 60. An nMOS (Metal Oxide Semiconductor) transistor 20 is formed in an element forming region 50 isolated by the isolating oxide film 5.

The nMOS transistor 20 includes a pair of source/drain regions 11, a gate oxide film 15 and a gate electrode layer 17. A pair of the source/drain regions 11 are formed on the surface of the p-type silicon substrate 1 in such a manner as to be separated from each other at a specified distance. The source/drain region 11 has a double structure of an $n^-$ impurity diffusion region 7 doped with an n-type impurity at a relatively low concentration and an $n^+$ impurity concentration region 9 doped with an n-type impurity at a relatively high concentration, that is, it has an LDD (Lightly Doped Drain) structure. A gate electrode layer 17 is formed, by way of a gate oxide film 15, on a region surrounded by a pair of the source/drain regions 11.

The source/drain region 11 having an LDD structure is effective to relax a field intensity in the channel direction near the drain region, and hence to suppress the generation of hot-electrons. The source/drain region 11 is adjacent to the isolating oxide film 5. In addition, a side wall insulating layer 19 is formed for covering the side wall of the gate electrode layer 17.

A $p^+$ impurity diffusion region 3 is formed within the p-type silicon substrate 1 in such a manner as to be contacted with the lower surface of the isolating oxide film 5 in the element isolating region 60 and to be positioned near the lower side of the nMOS transistor 20 in the element forming region 50. The p-type impurity concentration of the $p^+$ impurity diffusion region 3 is set to be higher than that of the p-type silicon substrate 1. The $p^+$ impurity diffusion region 3 has the peak of the p-type impurity concentration along the dotted line 3a. The $p^+$ impurity diffusion region 3 and the element isolating oxide film 5 function to electrically isolate the nMOS transistor 20 from other elements.

FIGS. 25, 26 are diagrams each showing a change in carrier concentration relative to a change in depth along each of lines $C_{5A}$–$C_{5B}$ and $D_{5A}$–$D_{5B}$ of FIG. 24. Referring to FIGS. 25, 26, in the prior art semiconductor device, the p-type impurity concentration of the p-type silicon substrate 1 is substantially $1\times10^{15}$ cm$^{-3}$; and the p-type impurity concentration of the $p^+$ impurity diffusion region 3 is in the range of from $1\times10^{17}$ cm$^{-3}$ to $1\times10^{18}$ cm$^{-3}$. On the other hand, the n-type impurity concentration of the $n^+$ impurity diffusion region 9 is less than $1\times10^{20}$ cm$^{-3}$, and the n-type impurity concentration of the $n^-$ impurity diffusion region 7 is in the range of from $1\times10^{17}$ cm$^{-1}$ to $1\times10^{18}$ cm$^{-3}$.

Next, a method of fabricating a semiconductor device shown in FIG. 24 according to the prior art will be described.

FIGS. 27 to 34 are schematic sectional views showing processes of fabricating a semiconductor device according to the prior art in sequence.

Referring to FIG. 27, a thin silicon oxide film 21 is formed over the whole surface of a p-type silicon substrate 1. A silicon nitride film 23 is formed over the whole surface of the thin silicon oxide film 21.

Referring to FIG. 28, a photoresist 25 is applied over the whole surface of the silicon nitride film 23. The photoresist 25 is patterned by exposure. The silicon nitride film 23 is patterned using the patterned photoresist 25 as a mask. After that, the resist pattern 25 is removed.

Referring to FIG. 29, a portion exposed from the silicon nitride film 23 is selectively oxidized by LOCOS (Local Oxidation of Silicon) using the silicon nitride film 23 as a mask. An isolating oxide film 5 is formed on the surface of the p-type silicon substrate 1 by this selective oxidation. After that, the silicon nitride film 23 and the thin silicon oxide film 21 on the surface of the p-type silicon substrate 1 are sequentially removed by etching.

Referring to FIG. 30, ions of boron (B) are implanted in the whole surface of the p-type silicon substrate 1. With this ion implantation, a $p^+$ impurity diffusion region 3 is formed within the p-type silicon substrate 1 in such a manner as to be positioned near the lower side of the isolating oxide film 5 in the element isolating region and to be positioned at a specified depth from the surface of the p-type silicon substrate 1. In addition, the impurity concentration of the $p^+$ impurity diffusion region 3 is set to be higher than that of the p-type silicon substrate 1.

Referring to FIG. 31, a thin silicon oxide film 15 is formed on the exposed surface of the p-type silicon substrate 1 by thermal oxidation or the like. A polycrystalline silicon layer 17 is formed over the whole surface of the p-type silicon substrate 1.

Referring to FIG. 32, the polycrystalline silicon layer 17 and the thin silicon oxide film 15 are sequentially patterned by photolithography, RIE (Reactive Ion Etching) or the like. A gate electrode layer 17 and a gate oxide film 15 are thus formed. Ions of phosphorous (P) are implanted over the whole surface of the p-type silicon substrate 1 using the gate electrode layer 17 and the isolating oxide film 5 as a mask. With this ion implantation, a pair of $n^-$ impurity diffusion regions 7 are formed on the surface of the p-type silicon substrate 1 in such a manner as to surround the lower region of the gate electrode layer 17.

Referring to FIG. 33, a silicon oxide film is formed over the whole surface of the p-type silicon substrate 1, and then the silicon oxide film is subjected to anisotropic etching. With this etching, a side wall insulating layer 19 is formed in such a manner as to cover the side wall of the gate electrode layer 17.

Referring to FIG. 34, ions of arsenic (As) are implanted in the whole surface of the p-type silicon substrate 1 using the side wall insulating layer 19, gate electrode layer 17 and the isolating oxide film 13 as a mask. With this ion-implantation, a pair of $n^+$ impurity diffusion regions 9 are formed in such a manner as to surround the lower regions of the gate electrode layer 17 and the side wall 19. An n-type source/drain region 11 having an LDD (Lightly Doped Drain) is formed of the $n^+$ impurity diffusion region 9 and the $n^-$ impurity diffusion region 7.

An nMOS transistor 20 is formed of a pair of the source/drain regions 11, gate oxide film 15 and gate electrode layer 17.

In addition, "$n^+$" means a relatively high concentration of an n-type impurity, and "$n^-$" means a relatively low concentration of an n-type impurity. On the other hand, "p+" means a relatively high concentration of a p-type impurity, and "p−" means a relatively low concentration of a p-type impurity.

As is well-known, in the LOCOS structure, when the isolating oxide film 5 is formed, crystal defects 50 are generated near the interface between the p-type silicon substrate 1 and the isolating oxide film 5 as shown in FIG. 24, and they tend to cause leakage current; and the leakage current flowing by way of the crystal defects 50 is increased when the crystal defects 50 are distributed in a depletion layer at the pn-junction constituted of the n-type source/drain region 11 and the p-type silicon substrate 1. This is described, for example in Sugano, Ono and Usui, editor: "MOS Field Effect Transistor", *Nikkan Kogyo*, p219 and *Solid-State Electronics*, Vol. 9, 1966, pp783–806.

For this reason, it is necessary to design an impurity distribution for suppressing the extension of a depletion layer at the pn-junction. Such an impurity distribution is disclosed in Unexamined Japanese Patent Laid-Open No. 2-133929. The construction disclosed in this reference will be described below.

FIG. 35 is a schematic sectional view showing the construction of a semiconductor device shown in the above-described reference. Referring to FIG. 35, an isolating oxide film 305 is selectively formed on the surface of a silicon substrate 310. A p+ channel cut region 303 is formed within the p-type silicon substrate 301 in such a manner as to be positioned near the lower side of the isolating oxide film 305. An nMOS transistor 320 is formed in an element forming region isolated by the isolating oxide film 305 and the p+ channel cut region 303.

The nMOS transistor 320 has a pair of source/drain regions each having portions 307, 309, 313, a gate insulating film 315, and a gate electrode layer 317. A pair of the source/drain regions each having the portions 307, 309, 313 are formed on the surface of the p-type silicon substrate 301. The gate electrode layer 317 is formed, by way of the gate insulating film 315, on a region surrounded by a pair of the source/drain regions.

In the construction of the semiconductor device disclosed in the above reference, the source/drain region has the portions 307 and 309 constituting an LDD structure, and a portion 313 for preventing leakage current due to crystal defects. Specifically, the n-type impurity diffusion region 313 is provided at the side end portion of the isolating oxide film 305, so that crystal defects formed near the interface between the p-type silicon substrate 301 and the isolating oxide film 305 upon formation of the isolating insulating film 305 are contained in the n-type impurity diffusion region 313. This makes it possible to suppress the crystal defects introduced at the side end portion of the isolating oxide film 305 from being distributed in a depletion layer upon operation of the nMOS transistor, and hence to prevent the generation of leakage current due to the distribution of crystal defects at the side end portion of the isolating oxide film 305 in a depletion layer. The characteristics of the element can be thus improved.

The construction of the above-described reference shown in FIG. 35 is disadvantageous in that: (1) circuit operation is delayed, and (2) element isolating ability is low.
(1) Delay in Circuit Operation In the semiconductor device shown in FIG. 35, the n-type impurity diffusion region 313 is added for preventing the generation of leakage current due to crystal defects; however, by the addition of the n-type impurity diffusion region 313, the area of the pn-junction between the p-type silicon substrate 301 and the n-type source/drain region is enlarged. As a result, the junction capacity at the pn-junction is increased, which leads to delay in circuit operation.
(2) Reduction in Element Isolating Ability FIG. 36 is a schematic sectional view showing the construction in which a plurality of the semiconductor devices shown in FIG. 35 are formed. Referring to FIG. 36, a gap $L_2$ between the n-type source/drain regions of the adjacent nMOS transistors 320 is reduced by the addition of the n-type impurity diffusion region 313. Namely, in the case where the n-type impurity diffusion region 313 is not provided, a gap $L_1$ between the n-type source/drain regions of the adjacent nMOS transistors 320 is substantially the same as the width of the isolating oxide film 305. On the contrary, in the case where the n-type impurity diffusion region 313 is provided, the gap $L_2$ between the adjacent n-type source/drain regions is made narrower than the width of the isolating oxide film 305. As a result, the electrically isolating ability is reduced between the n-type source/drain regions of the adjacent nMOS transistors.

SUMMARY OF THE INVENTION

An object of the present invention is to reduce the generation of leakage current due to the distribution of crystal defects in a depletion layer.

Another object of the present invention is to provide a semiconductor device capable of suppressing the delay of the circuit operation and improving the electrically isolating ability.

A semiconductor device of the present invention includes a semiconductor substrate of a first conducting type, an isolating/insulating film, a first impurity region of the first conducting type, a second impurity region of a second conducting type, and a third impurity region of the first conducting type. The semiconductor substrate has a main surface, and it is doped with an impurity of the first conducting type at a first concentration. The isolating/insulating film is formed on the main surface of the semiconductor substrate in such a manner as to isolate an element forming region. The first impurity region is positioned to be contacted with the lower surface of the isolating/insulating film within the semiconductor substrate, and it is doped with an impurity of the first conducting type at a second concentration higher than the first concentration. The second impurity region is formed at the main surface of the semiconductor substrate within the element forming region adjacent to the isolating/insulating film. The third impurity region is formed within the semiconductor substrate in such a manner as to be positioned along the isolating/insulating film between the first impurity region and the second impurity region, and to be contacted with the second impurity region, and it is doped with an impurity of the first conducting type at a third concentration higher than the first concentration and lower than the second concentration.

In the semiconductor device of the present invention, the third impurity region is contacted with the second impurity region for forming a source/drain region of a MOS transistor at the side end portion of the isolating/insulating film. The third impurity region has an impurity concentration higher than that of the semiconductor substrate, thereby suppressing the extension of a depletion layer at the pn-junction constituted of the third impurity region and the second impurity region. Thus, it becomes possible to reduce crystal defects entrapped in the depletion layer, and hence to lower leakage current caused by the crystal defects.

The third impurity region has the conducting type reversed to that of the second impurity region for forming a source/drain region of a MOS transistor, so that even when the second impurity region is provided, the area of the pn-junction between the source/drain region of a MOS transistor and the semiconductor substrate is not enlarged and thereby the capacity of the pn-junction is not increased. The high speed circuit operation can be thus kept.

Moreover, even when the third impurity region is provided, a gap between the second impurity regions for forming the source/drain regions of the adjacent MOS transistors is not made narrow. The third impurity region contacted with the second impurity region has a concentration of an impurity of the first conducting type which is higher than that of the semiconductor substrate. Since the third impurity region having such a high impurity concentration is added between the second impurity regions for forming the source/drain regions of the adjacent MOS transistors excluding the first impurity region, the electrically isolating ability can be enhanced.

A method of fabricating a semiconductor device according to the present invention includes the following processes.

An isolating/insulating film is formed on a main surface of a semiconductor substrate which is of a first conducting type and is doped with an impurity of the first conducting type at a first concentration in such a manner as to isolate an element forming region. A first impurity region of the first conducting type, which is doped with an impurity of the first conducting type at a second concentration higher than the first concentration, is formed within the semiconductor substrate in such a manner as to be contacted with the lower surface of the isolating/insulating film. A second impurity region of a second conducting type is formed at the main surface of the semiconductor substrate within the element forming region adjacent to the isolating/insulating film. A third impurity region of the first conducting type, which is doped with an impurity of the first conducting type at a third concentration higher than the first concentration and lower than the second concentration, is formed within the semiconductor substrate in such a manner as to be positioned along the isolating/insulating film between the first impurity region and the second impurity region, and to be contacted with the second impurity region.

In the method of a semiconductor device according to the present invention, there can be fabricated a semiconductor device capable of reducing the generation of leakage current due to crystal defects, suppressing the delay of circuit operation, and enhancing the electrically isolating ability.

According to a preferred mode of the method of fabricating a semiconductor device according to the present invention, the process of forming the third impurity region further includes a process of implanting an impurity of the first conducting type in the semiconductor substrate at an angle ranging from 30° to 60° relative to the normal line perpendicular to the main surface of the semiconductor substrate by an oblique rotation type implantation method.

In the above-described preferred mode of the fabricating method, since the first impurity region is formed by oblique rotation type implantation, the first impurity region and the second impurity region are formed to be close to each other near the side end portion of the isolating/insulating film. The first impurity region has a concentration of an impurity of the first conducting type higher than that of the third impurity region, and accordingly, the first impurity region and third impurity region are close to each other, so that the extension of a depletion layer can be further suppressed. Accordingly, the generation of leakage current due to the distribution of crystal defects in the depletion layer can be further suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments of the present invention will be described with reference to the drawings.

Embodiment 1

Figure 1:
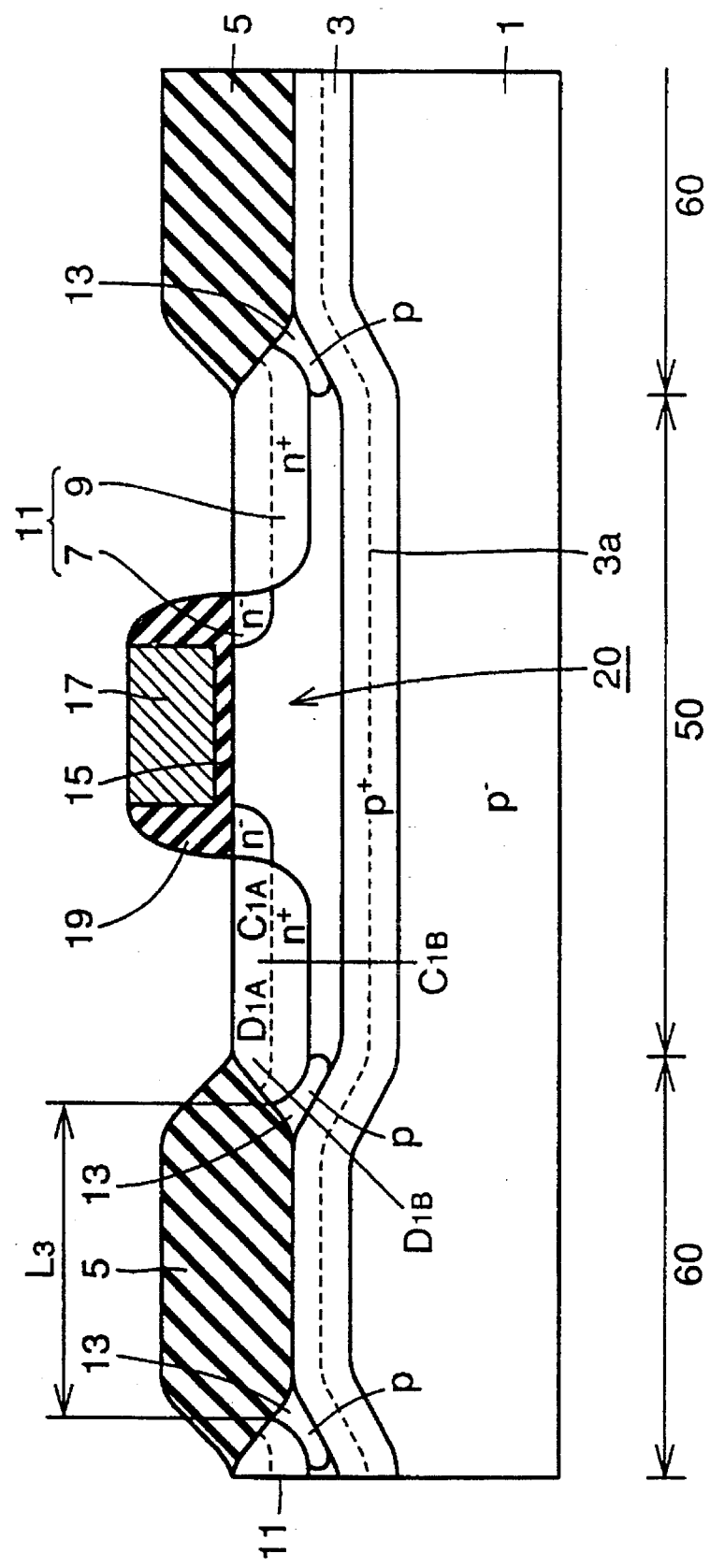
FIG. 1 is a schematic sectional view showing the construction of a semiconductor device in a first embodiment of the present invention.

Referring to FIG. 1, an isolating oxide film 5 made of silicon oxide is formed at the surface of a p⁻ silicon substrate 1 in an element isolating region 60. An nMOS transistor 20 is formed at the surface of the p⁻ silicon substrate 1 in an element forming region 50 isolated by the isolating oxide film 5.

The nMOS transistor 20 has a pair of source/drain regions 11, a gate oxide film 15, and a gate electrode layer 17. A pair of the n-type source/drain regions 11 are formed at the surface of the p⁻ silicon substrate 1 in such a manner as to be separated from each other at a specified distance. A pair of the source/drain regions 11 have an LDD structure. Specifically, the source/drain region 11 is composed of a double structure of an n⁻ impurity diffusion region 7 with a relative low concentration of impurity and an n⁺ impurity diffusion region 9 with a relative high concentration of impurity. A gate electrode layer 17 is formed, by way of a gate oxide film 15, on a region sandwiched by a pair of the source/drain regions 11.

A side wall insulating layer 19 is formed of for example a silicon oxide film in such a manner as to cover the side wall portion of the gate electrode layer 17.

A p⁺ impurity diffusion region 3 is formed within the p⁻ silicon substrate 1 in such a manner as to be contacted with the lower surface of the isolating oxide film 5 in the element isolating region 60 and to be positioned at a specified depth from the surface of the p⁻ silicon substrate 1 in the element forming region 50. The p⁺ impurity diffusion region 3 has the impurity concentration peak at a position shown by the dotted line 3a.

A p-type impurity diffusion region 13 is formed near the side end portion of the isolating oxide film 5 and between the n-type source/drain region 11 and the p⁺ impurity diffusion region 3 in such a manner as to be contacted with the n-type source/drain region 11.

Figure 2:
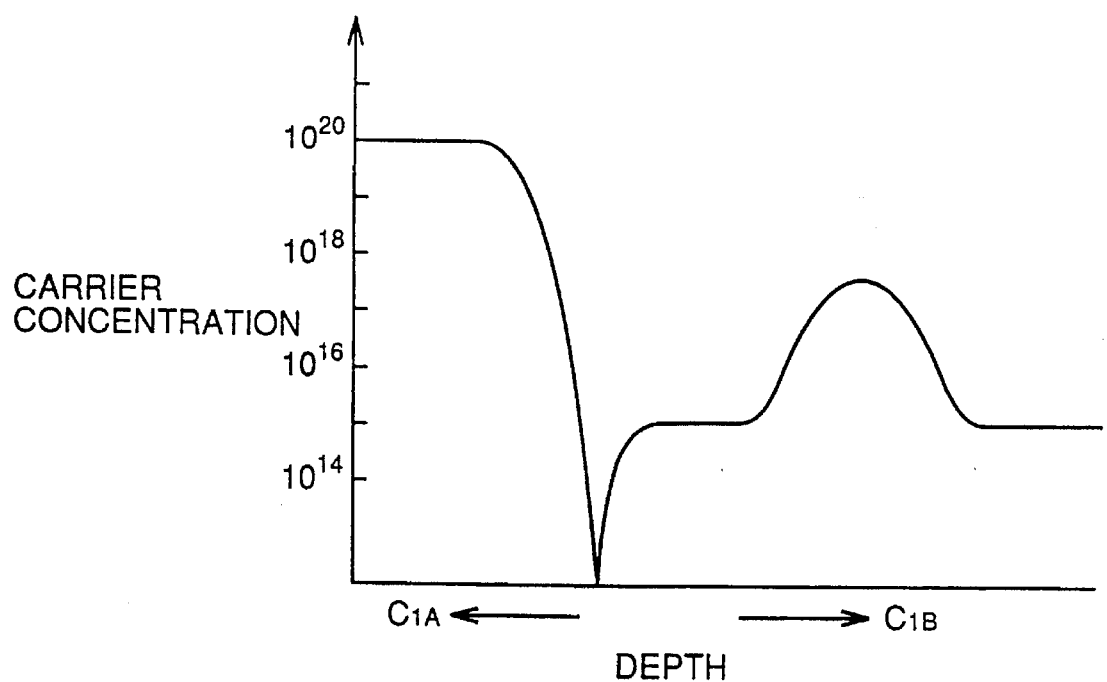
FIG. 2 is a diagram showing a change in carrier concentration relative to a change in depth along line $C_{1A}$–$C_{1B}$ of FIG. 1.
Figure 3:
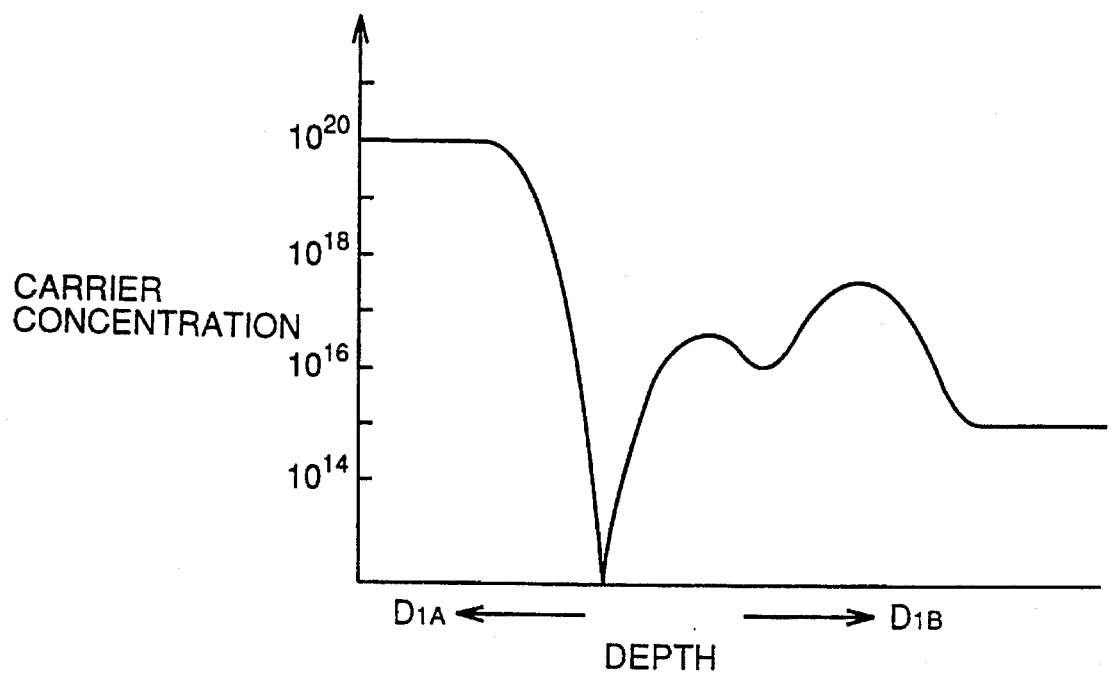
FIG. 3 is a diagram showing a change in carrier concentration relative to a change in depth along line $D_{1A}$–$D_{1B}$ of FIG. 1.

Referring to FIGS. 2 and 3, the p-type impurity concentration of the p⁻ silicon substrate 1 is substantially $1 \times 10$ cm⁻³; the p-type impurity concentration of the p⁺ impurity diffusion region 3 is in the range of from $1 \times 10^{17}$ cm⁻³ to $1 \times 10^{18}$ cm⁻³; and the p-type impurity concentration of the p-type impurity diffusion region 13 is in the range of from $1 \times 10^{16}$ cm⁻³ to $1 \times 10^{17}$ cm⁻³. The n-type impurity concentration of the n-impurity diffusion region 7 is in the range of from $1 \times 10^{17}$ cm⁻³ to $1 \times 10^{18}$ cm⁻³; and the n-type impurity concentration of the n⁺ impurity diffusion region 9 is less than $1 \times 10^{20}$ cm⁻³.

Figure 4:
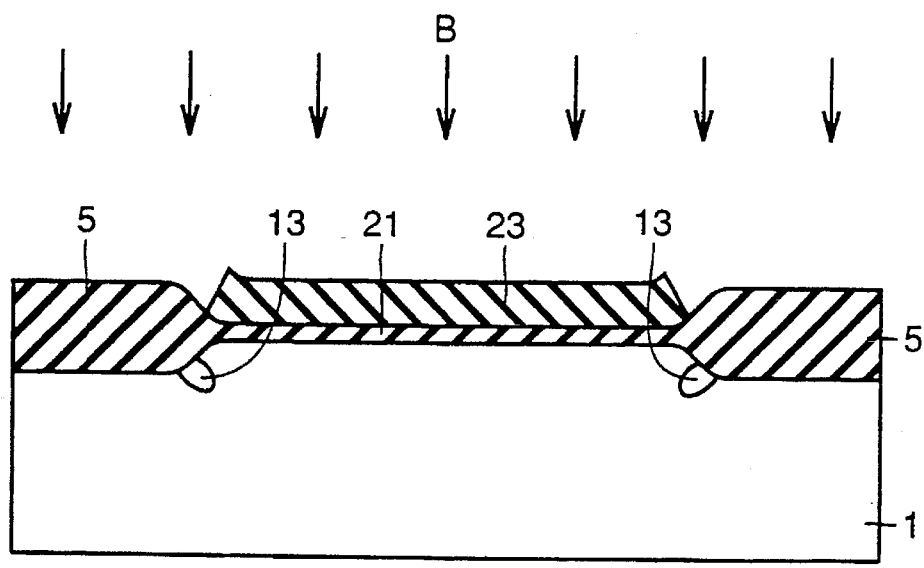
FIGS. 4 to 9 schematic views showing processes of fabricating a conductor device in the first embodiment of the present invention in sequence.

A method of fabricating a semiconductor device in Embodiment 1 of the present invention will be described below. The fabricating method in this embodiment is first goes through processes shown in FIGS. 27 to 29. After that, referring to FIG. 4, ions of boron (B) are implanted in a dose of from $1 \times 10^{12}$ cm⁻² to $1 \times 10^{13}$ cm⁻² at an accelerating voltage of from 80 to 130 keV using a silicon nitride film 23 and the isolating oxide film 5 as a mask. With this ion implantation, a p-type impurity diffusion region 13 is formed at the side end portion of the isolating oxide film 5. After that, the silicon nitride film 23 and a thin silicon oxide film 21 on the element forming region are removed.

Figure 5:
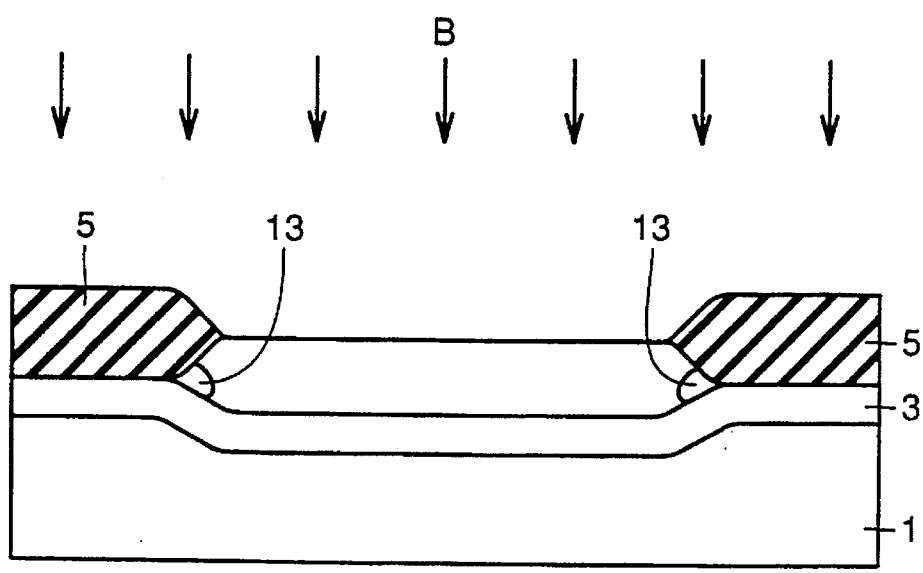

Referring to FIG. 5, ions of boron are implanted in the whole surface of the p⁻ silicon substrate 1 in a dose of from $3 \times 10^{12}$ cm⁻² to cm to $5 \times 10^{12}$ cm⁻² at an accelerating voltage of from 100 to 150 keV. With this ion implantation, the p⁺ impurity diffusion region 3 is formed within the p⁻ silicon substrate 1. The p⁺ impurity diffusion region 3 is formed in such a manner as to be contacted with the lower surface of the isolating oxide film 5 in the element isolating region, and to be positioned at a specified depth from the surface of the p⁻ silicon substrate 1 in the element forming region.

Figure 6:
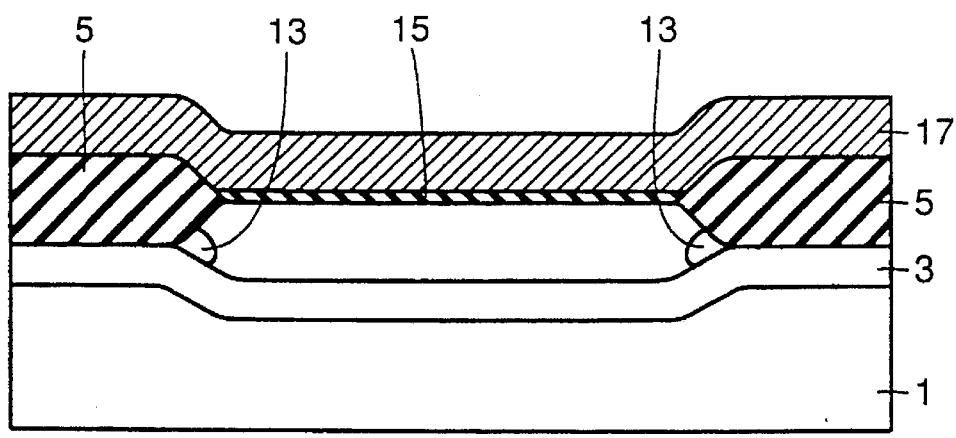

Referring to FIG. 6, a thin silicon oxide film 15 is formed over the whole surface of the p⁻ silicon substrate 1 by thermal oxidation. A polycrystalline silicon film 17 doped with an impurity is formed over the whole surface of the p⁻ silicon substrate 1. The polycrystalline silicon film 17 and the thin silicon oxide film 15 are sequentially patterned by photolithography, RIE or the like.

Figure 7:
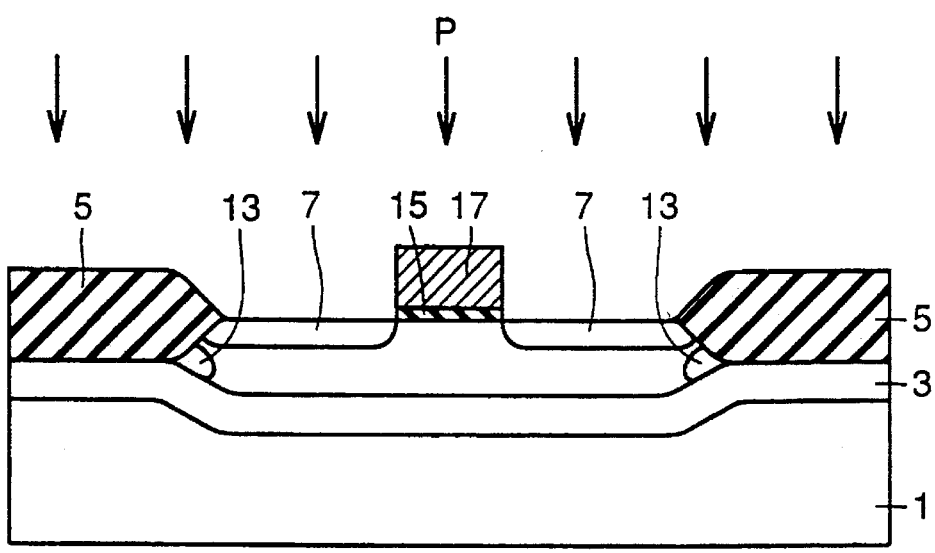

Referring to FIG. 7, a gate electrode layer 17 and a gate oxide film 15 are formed by this patterning. Ions of phosphorus (P) are implanted in the whole surface of the p⁻ silicon substrate 1 in a dose of from $1 \times 10^{13}$ cm⁻² to $3 \times 10^{13}$ cm⁻² at an accelerating voltage of from 30 to 40 keV using the gate electrode layer 17 and the isolating oxide film 5 as a mask. With this ion implantation, a pair of n- impurity diffusion regions 7 are formed in such a manner as to surround a region positioned on the lower side of the gate electrode layer 17.

Figure 8:
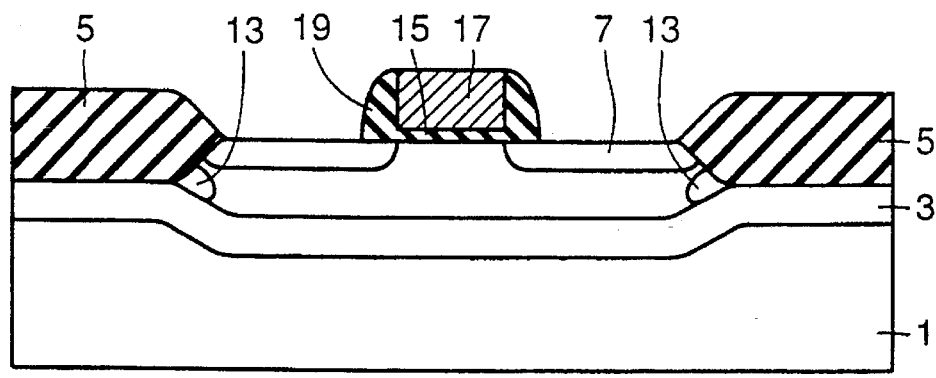

Referring to FIG. 8, a silicon oxide film is formed over the whole surface of the p⁻ silicon substrate 1, and thereafter the silicon oxide film is subjected to anisotropic etching. With this etching, a side wall insulating layer 19 is formed so as to cover the side wall of the gate electrode layer 17.

Figure 9:
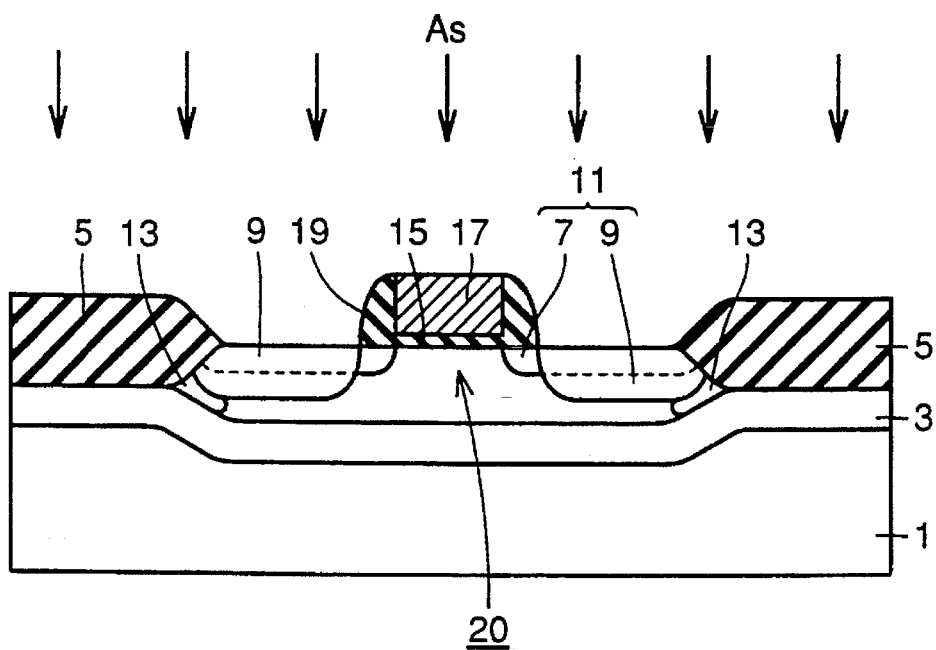

Referring to FIG. 9, ions of arsenic (As) are implanted in a dose of from $1 \times 10^{15}$ cm⁻² to $3 \times 10^{15}$ cm⁻² at an accelerating voltage of from 30 to 60 keV using the gate electrode layer 17, side wall insulating layer 19 and isolating oxide film 5 as a mask. With this implantation, the n⁺ impurity diffusion region 9 is formed in such a manner as to surround regions positioned on the lower sides of the gate electrode layer 17 and the side wall insulating layer 19. The n⁺ impurity diffusion region 9 is also formed in such a manner as to be contacted with the p⁺ impurity diffusion region 13 near the side end portion of the isolating oxide film 5. The source/drain region 11 having the LDD structure is formed by the n⁺ impurity diffusion region 9 and the n⁻ impurity diffusion region 7.

An nMOS transistor 20 is thus formed of a pair of the source/drain regions 11, gate oxide film 15 and the gate electrode layer 17.

Figure 24:
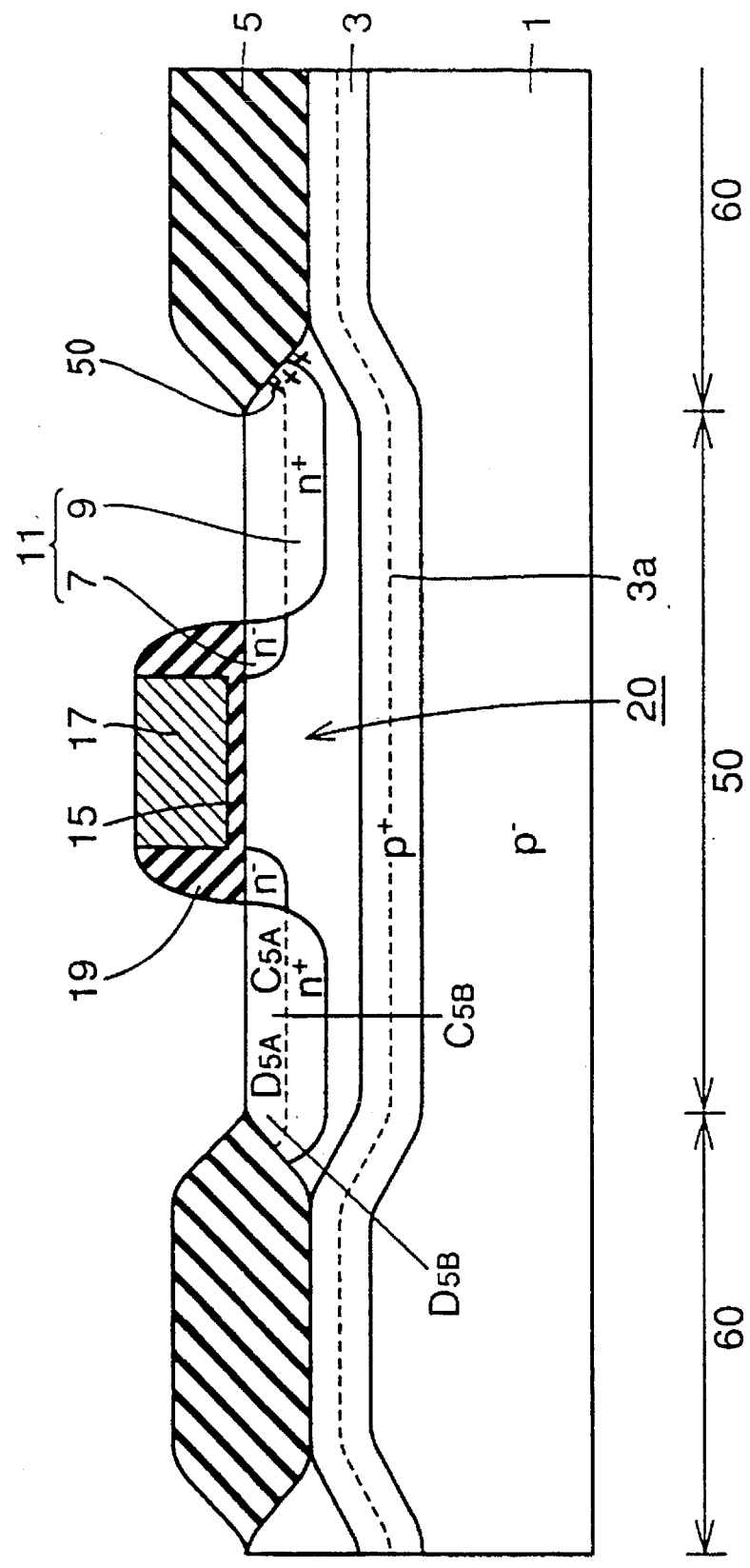
FIG. 24 is a schematic sectional view showing the construction of a semiconductor device in the prior art.
Figure 25:
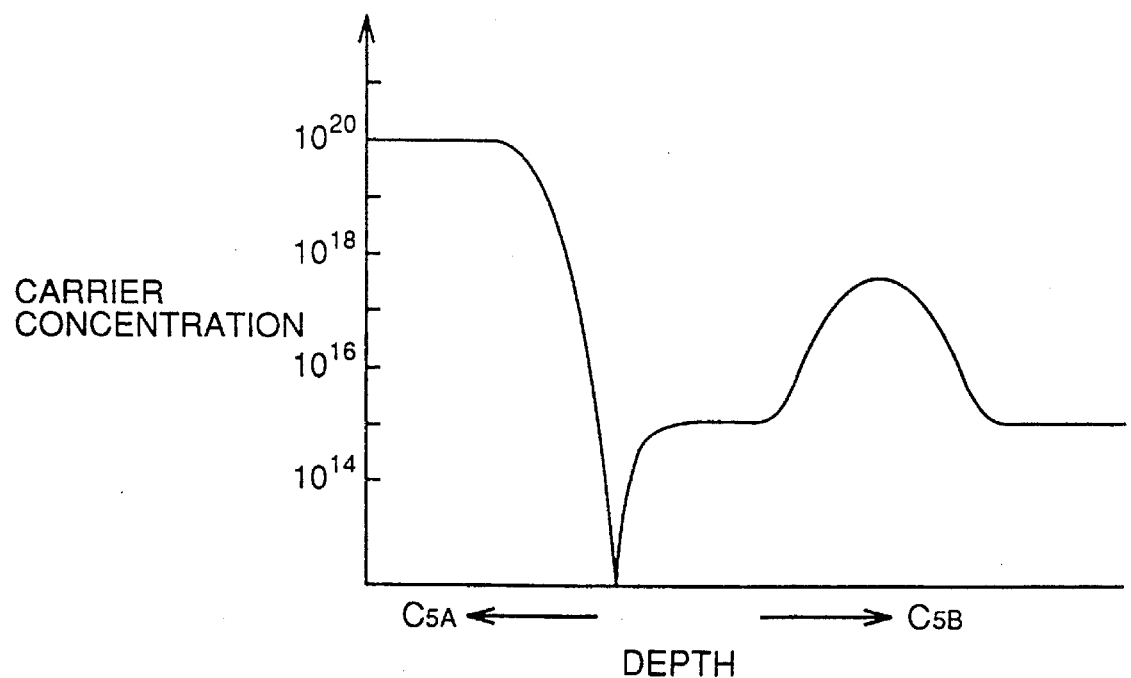
FIG. 25 is a diagram showing a change in carrier concentration relative to a change in depth along line $C_{5A}$–$C_{5B}$ of FIG. 24.
Figure 26:
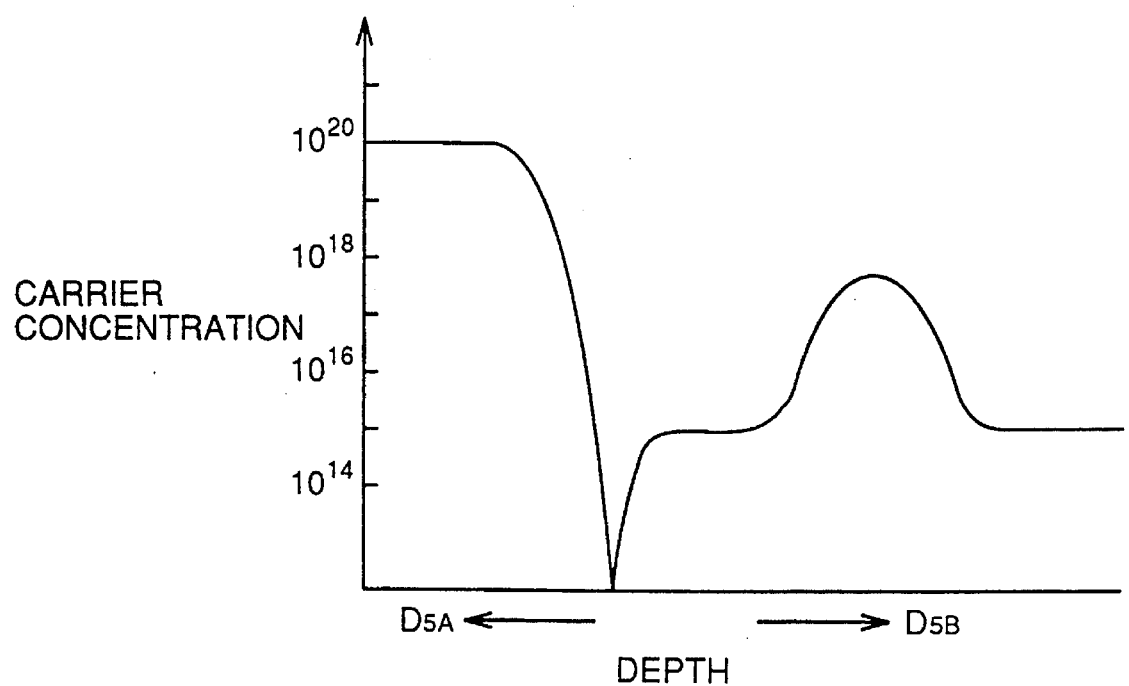
FIG. 26 is a diagram showing a change in carrier concentration relative to a change in depth along line $D_{5A}$–$D_{5B}$ of FIG. 24.

Next, the extension of the width of a depletion layer was simulated with respect to the semiconductor device in this embodiment shown in FIG. 1 and the prior art semiconductor device shown in FIG. 24. Hereinafter, the simulation method and the results thereof will be described.

Figure 10:
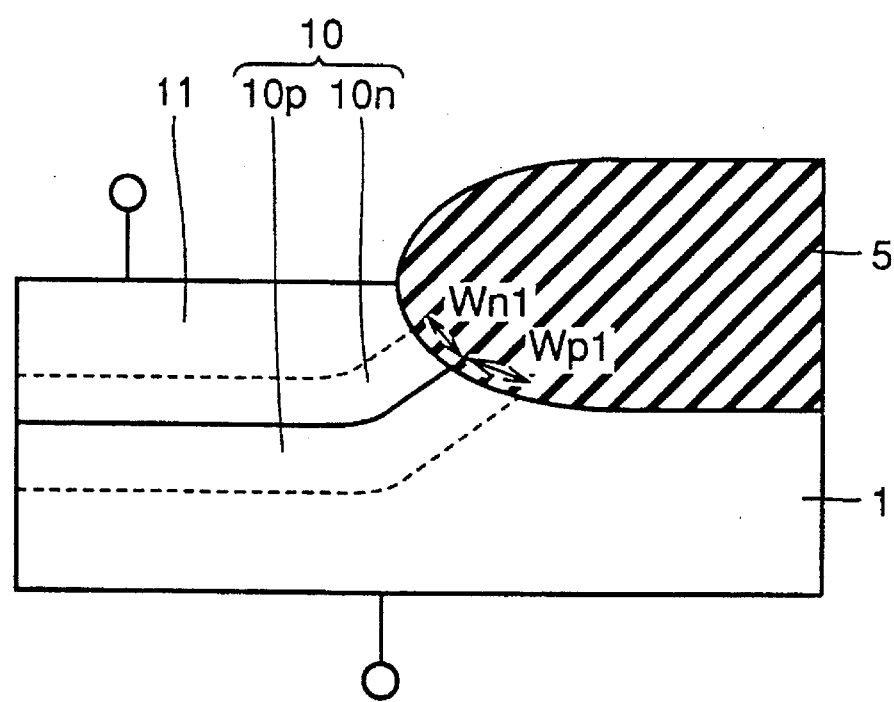
FIG. 10 is a view for defining the width of a depletion layer at a side portion of an isolating oxide film.

The width of a depletion layer at the side end portion of the isolating oxide film is defined as shown in FIG. 10. Referring to FIG. 10, a distance between the interface of the pn-junction constituted of the n-type source/drain region 11 and p⁻ silicon substrate 1 and the end portion of a depletion layer 10p extending on the n-type source/drain region 11 side is taken as $Wn_1$; and a distance between the interface of the pn-junction and the end portion of the depletion layer 10p extending on the p-silicon substrate 1 side is taken as $Wp_1$.

The width of the depletion layer was simulated with respect to the case where an electrode is formed on the source/drain region of the nMOS transistor, and a voltage of 5 V is applied to the n-type source/drain region.

Figure 11:
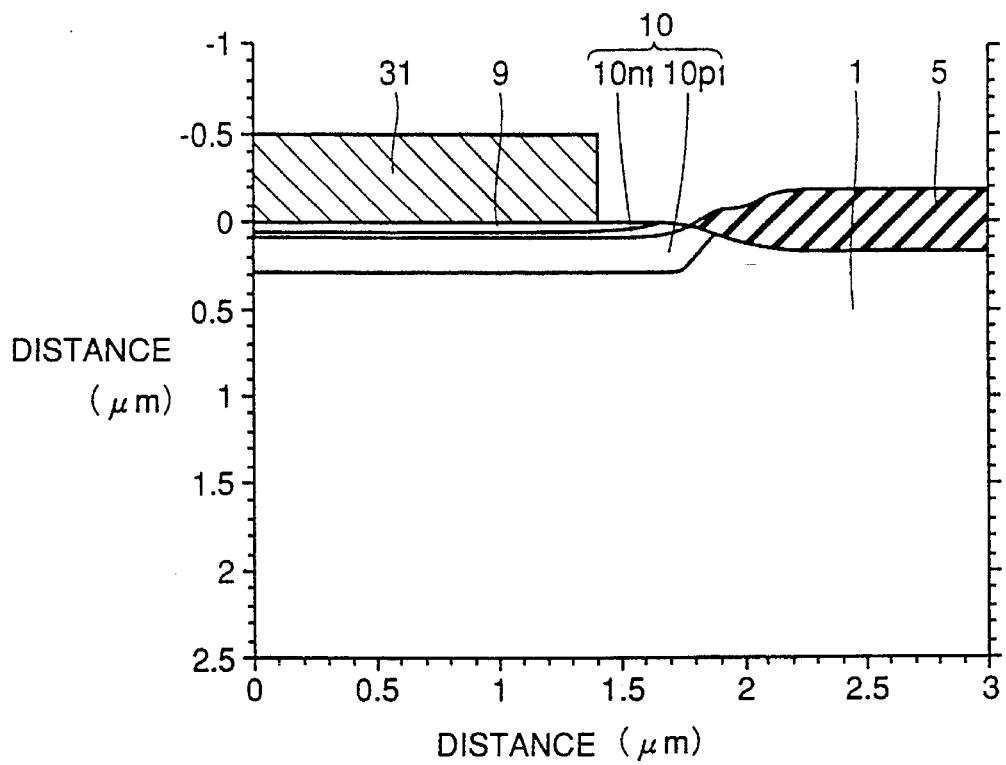
FIG. 11 is a view showing the simulation result of the width of a depletion layer in this embodiment.
Figure 12:
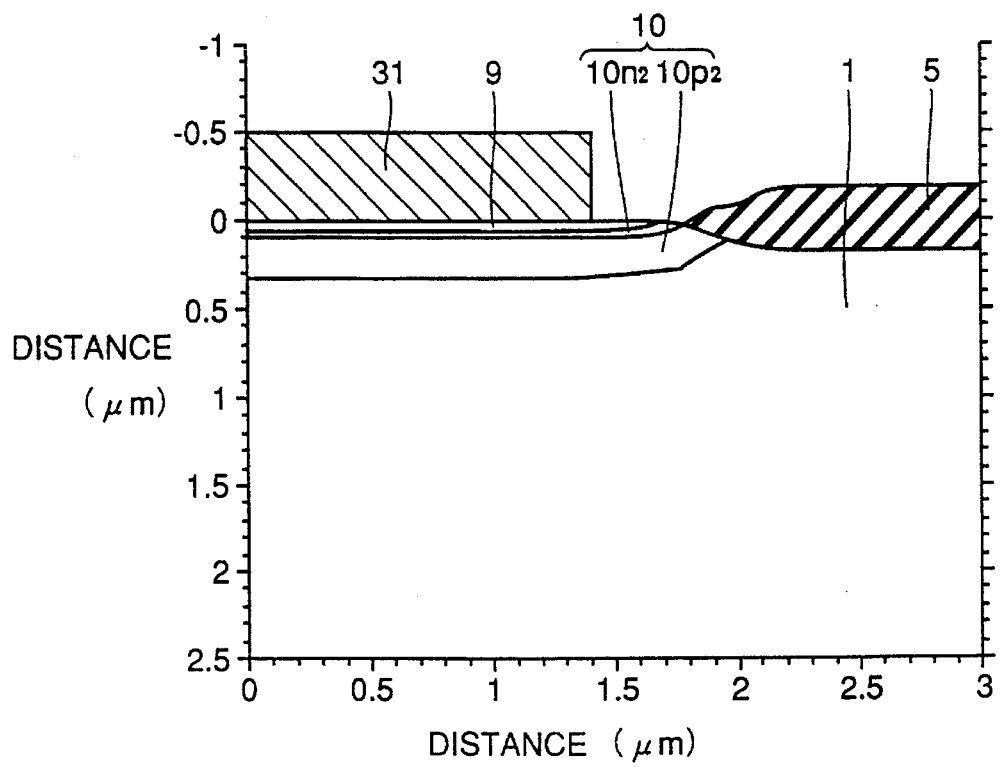
FIG. 12 is a view showing the simulation result of the width of a depletion layer in the prior art.

Referring to FIGS. 11, 12, it was revealed that respective depletion layers $10n_1$ and $10n_2$ extending on the source/drain region side in this embodiment (FIG. 11) and the prior art (FIG. 12) are little different from each other. On the contrary, the width $wp_1$ of the depletion layer $10p_1$ extending on the p⁻ silicon substrate 1 side in this embodiment was 0.13 μm, while the width $Wp_1$ of the depletion layer $10p_2$ in the prior art was 0.23 μm.

This simulation result showed that the extension of the depletion layer 10 can be significantly suppressed by formation of the p-type impurity diffusion region 13 as shown in the construction of this embodiment of FIG. 1. This makes it possible to reduce the ratio of crystal defects entrapped in the depletion layer 10 at the side end portion of the isolating oxide film 5, and to lower leakage current caused by the crystal defects entrapped in the depletion layer 10.

In addition, a conductive layer 31 formed on the surface of the silicon substrate 1 as shown in FIGS. 11, 12 is an electrode for applying a voltage to the n-type source/drain region 9. For convenience, in FIGS. 11, 12, the p-type impurity diffusion region 13 and the p⁺ impurity diffusion region 3 shown in FIGS. 1 and 24 are omitted.

As described above, in the semiconductor device in this embodiment, as shown in FIG. 1, the p-type impurity diffusion region 13 is formed in such a manner as to be contacted with the n-type source/drain region 9 at the side end portion of the isolating oxide film 5. The p-type impurity diffusion region 13 has a p-type impurity concentration higher than that of the p⁻ silicon substrate 1. Consequently, near the side end portion of the isolating oxide film 5, the extension of the depletion layer at the pn-junction constituted of the p-type impurity diffusion region 13 and the n-type source/drain region 11 can be suppressed; accordingly, the crystal defects entrapped in the depletion layer 10 are reduced, thereby lowering leakage current caused by the crystal defects.

In the semiconductor device in this embodiment, the p-type impurity diffusion region 13 has a conducting type reversed to that of the n-type source/drain region 11. As a consequence, even by provision of the p⁻ impurity diffusion region 13, the pn-junction area constituted of the n-type source/drain region 11 and p⁻ silicon substrate 1 is not enlarged, and thereby the pn-junction capacity is not increased, thus making it possible to keep the high speed circuit operation.

Moreover, even by provision of the p-type impurity diffusion region 13, a gap L3 between the n-type source/drain regions 11 of the adjacent nMOS transistors 20 is not narrowed.

The p-type impurity diffusion region 13 having a p-type impurity concentration higher than that of the p⁻ silicon substrate 1 is distributed between the n-type source/drain regions of the adjacent nMOS transistors 20, so that the electrically isolating ability between the adjacent nMOS transistors 20 can be enhanced as compared with the prior art shown in FIG. 24.

Embodiment 2

Figure 13:
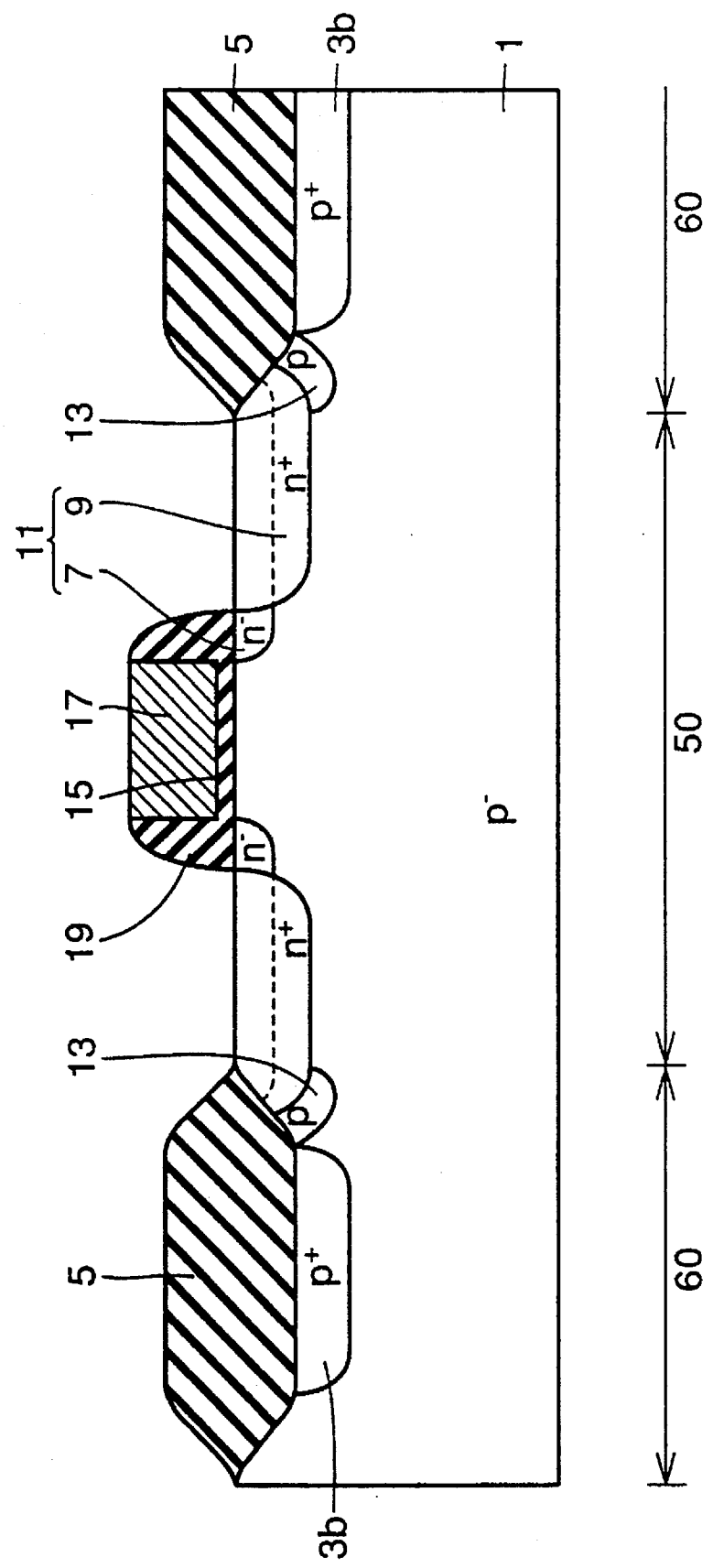
FIG. 13 is a schematic sectional view showing the construction of a semiconductor device in a second embodiment of the present invention.

Referring to FIG. 13, a semiconductor device in this embodiment is different from that of the embodiment shown in FIG. 1 in that the p⁺ impurity diffusion region 3a is replaced with a p⁺ impurity diffusion region 3b. Specifically, the p⁺ impurity diffusion region 3b in this embodiment is formed only within the element isolating region 60 in such a manner as to be contacted with the lower surface of the isolating oxide film 5. The p-type impurity concentration of the p⁺ impurity diffusion region 3bis in the range of from $1 \times 10^{17}$ cm⁻³ to $1 \times 10^-$ cm⁻³.

The other construction of this embodiment is substantially the same as that of Embodiment 1, and therefore, the explanation thereof is omitted.

In this way, the same effect as that of Embodiment 1 can be obtained even by replacing the p⁺ impurity diffusion region 3a with the p⁺ impurity diffusion region 3b.

Embodiment 3

Figure 14:
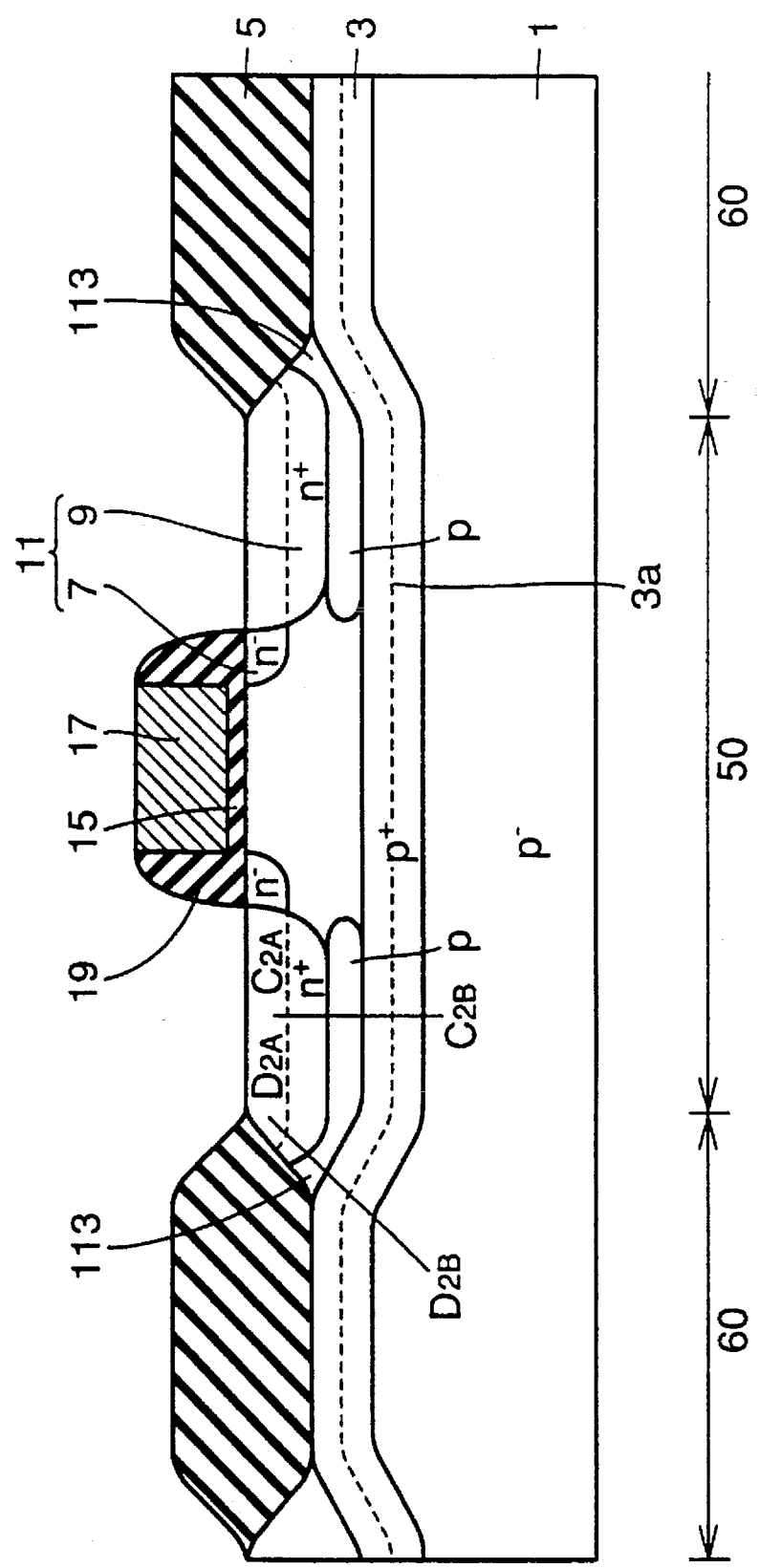
FIG. 14 is a schematic sectional view showing the construction of a semiconductor device in a third embodiment of the present invention.

Referring to FIG. 14, a semiconductor in this embodiment is different from that of Embodiment 1 in that the p-type impurity diffusion region 13 is replaced with a p-type impurity diffusion region 113. Specifically, the p-type impurity diffusion region 113 is formed in such a manner as to be contacted with the n-type source/drain region 11 near the side end portion of the isolating oxide film 5 and to extend along the lower surface of the n-type source/drain region 11.

Figure 15:
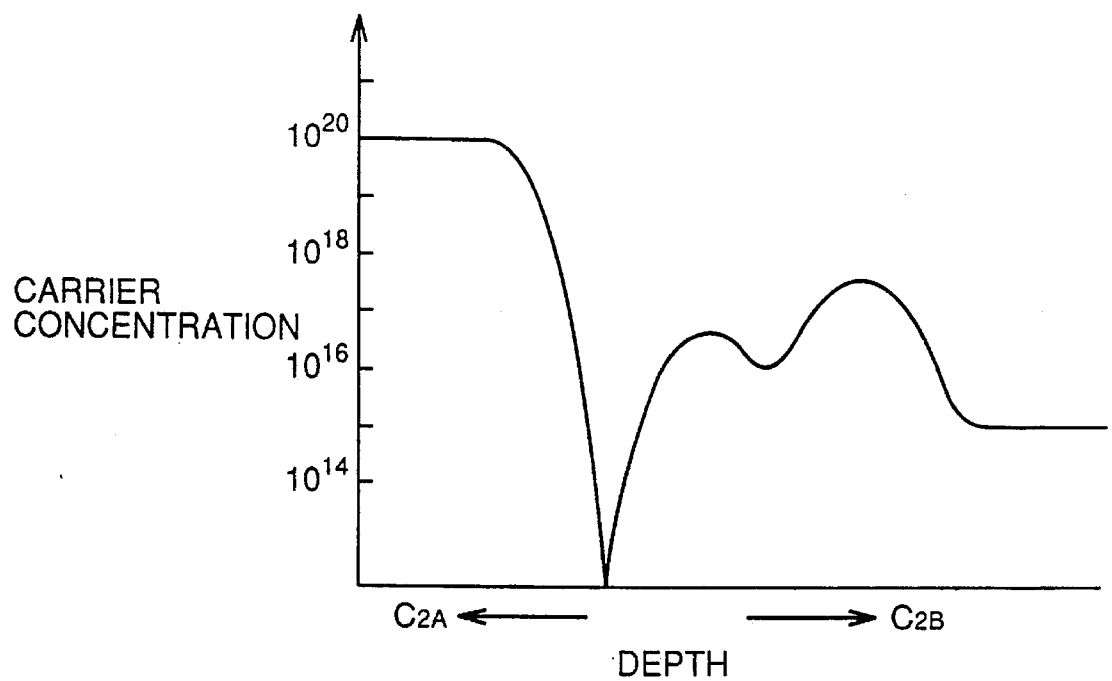
FIG. 15 is a diagram showing a change in carrier concentration relative to a change in depth along line $C_{2A}$–$C_{2B}$ of FIG. 14.
Figure 16:
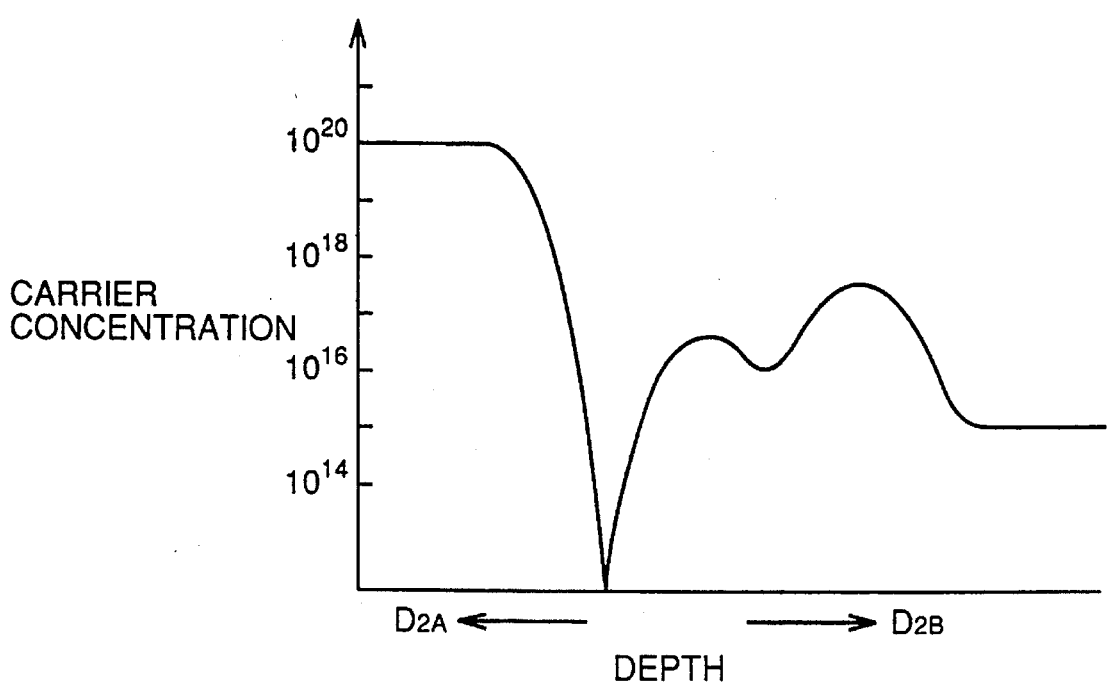
FIG. 16 is a diagram showing a change in carrier concentration relative to a change in depth along line $D_{2A}$–$D_{2B}$ of FIG. 14.

Referring to FIGS. 15, 16, since the p-type impurity diffusion region 113 extends along the lower surface of the n-type source/drain region 11, changes in carrier concentration along line $C_{2A}$–$C_{2B}$ and $D_{2A}$–$D_{2B}$ in FIG. 14 are almost similar to each other. The p-type impurity diffusion concentration of the p-type impurity diffusion region 113 is in the range of from $1 \times 10^{16}$ cm⁻³ to $1 \times 10^{17}$ cm⁻³.

In addition, the other construction in this embodiment is substantially the same as that of Embodiment 1, and therefore, the explanation thereof is omitted.

A method of fabricating a semiconductor device in this embodiment will be described below.

Figure 17:
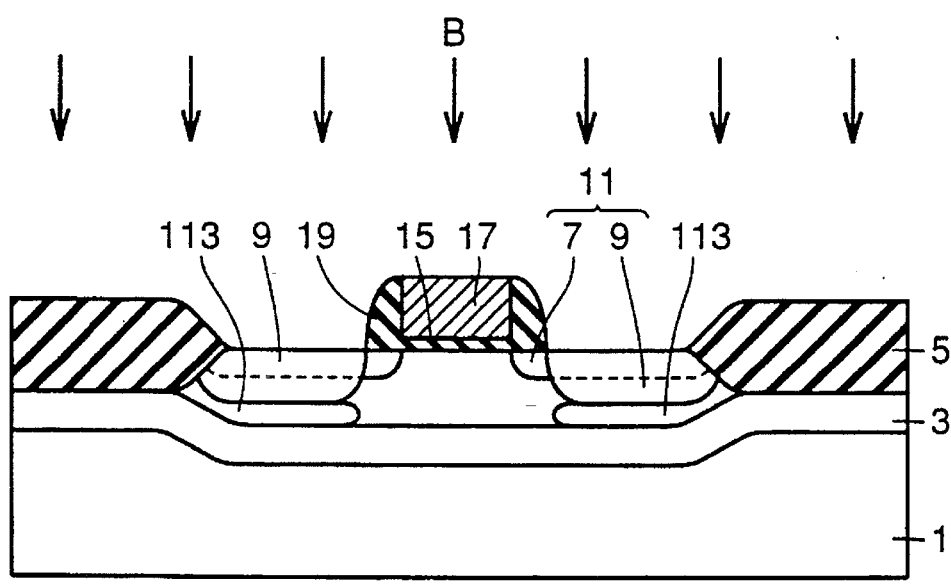
FIG. 17 is a schematic sectional view showing one process of fabricating the semiconductor device of the third embodiment of the present invention.

First, the fabricating method in this embodiment goes through processes shown in FIGS. 27 to 34. After that, referring to FIG. 17, ions of boron (B) are implanted in a dose of from $1 \times 10^{12}$ cm⁻² to $1 \times 10^{13}$ cm⁻² at an accelerating voltage of 80 to 130 keV using a gate electrode layer 17, a side wall insulating layer 19 and isolating oxide film 5 as a mask. With this implantation, a p-type impurity diffusion region 113 is formed in such a manner as to be contacted with the n-type source/drain region 11 at the side end portion of the isolating oxide film 5 and to extend in contact with the lower surface of the n-type source/drain region 11.

As described above, even in this embodiment, like Embodiment 1, the p-type impurity diffusion region 113 is contacted with the n-type source/drain region 11 at the side end portion of the isolating oxide film 5, and it has a p-type impurity concentration higher than that of the p⁻ silicon substrate 1. Accordingly, the extension of a depletion layer at the pn-junction constituted of the n-type source/drain region 11 and the p-type impurity diffusion region 13 can be suppressed. As a result, crystal defects entrapped in the depletion layer is reduced, to thus lower leakage current caused by the crystal defects.

Like Embodiment 1, the area of the pn-junction formed between the n-type source/drain region 11 and the p⁻ silicon substrate 1 is not enlarged by provision of the p-type impurity diffusion region 113, and thereby the pn-junction capacity is not increased, thus making it possible to keep the high speed circuit operation.

Like Embodiment 1, a gap between the source/drain regions 11 of the adjacent nMOS transistors 20 is not narrowed by provision of the p-type impurity diffusion region 113. Moreover, the p-type impurity diffusion region 113 having a p-type impurity concentration higher than that of the p⁻ silicon substrate 1 is distributed between the source/drain regions of the adjacent nMOS transistors. As a result, the electrically isolating ability between the adjacent nMOS transistors 20 is enhanced as compared with the prior art shown in FIG. 24.

Embodiment 4

Figure 18:
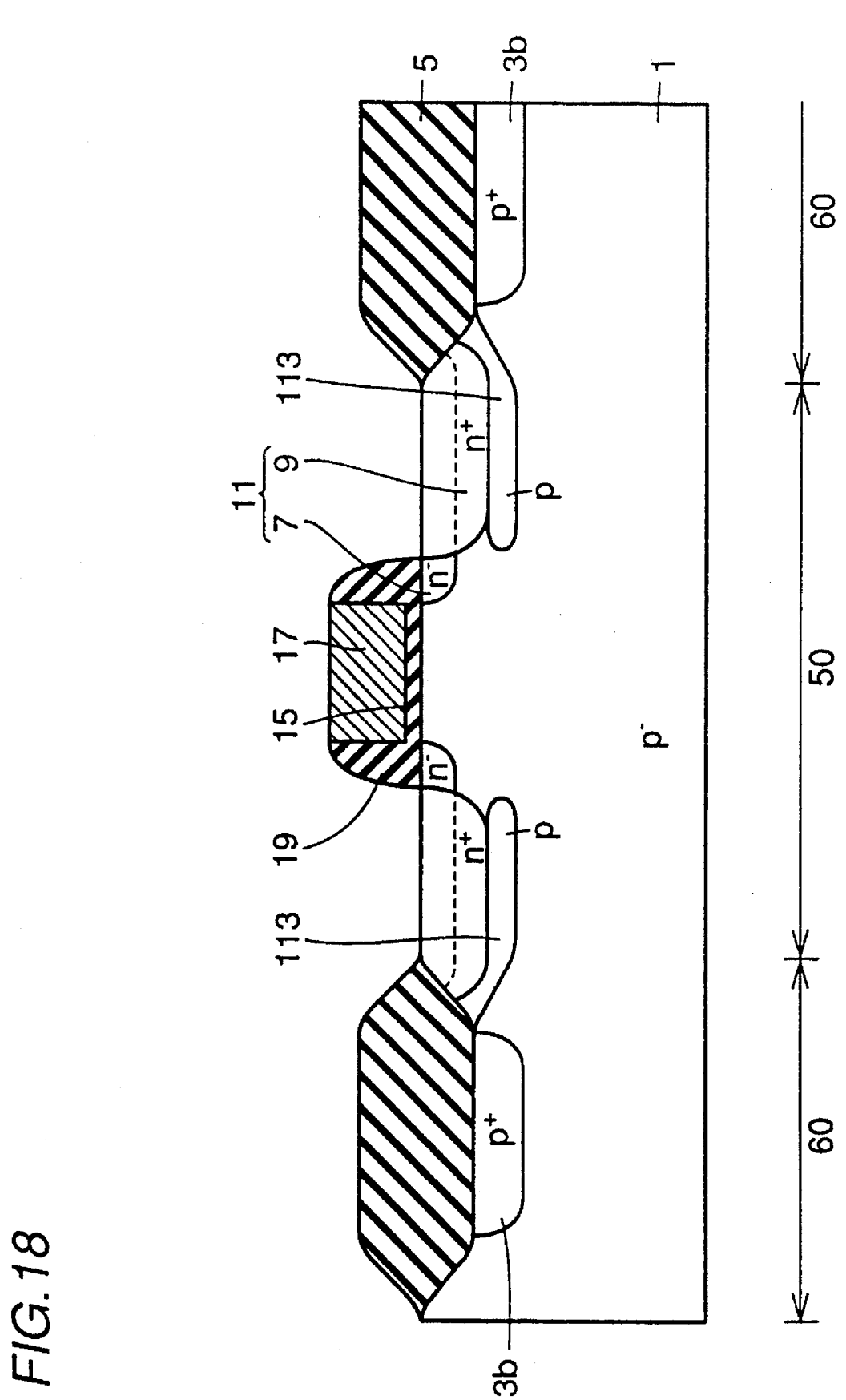
FIG. 18 is a schematic sectional view showing the construction of a semiconductor device in a fourth embodiment of the present invention.

Referring to FIG. 18, a semiconductor device in this embodiment is different from that in Embodiment 3 in that the p⁺ impurity diffusion region 3a is replaced with a p⁺ impurity diffusion region 3b. Specifically, the p⁺ impurity diffusion region 3bis formed only within the element isolating region 60 in such a manner as to be contacted with the lower surface of the isolating oxide film 5.

The other construction is substantially the same as that of Embodiment 3, and therefore, the explanation thereof is omitted.

Since the semiconductor device in this embodiment is different from that of Embodiment 3 only in that the p⁺ impurity diffusion region 3a is replaced with the p⁺ impurity diffusion region 3b, it exhibits the same effect as that of Embodiment 3.

Modification

Figure 19:
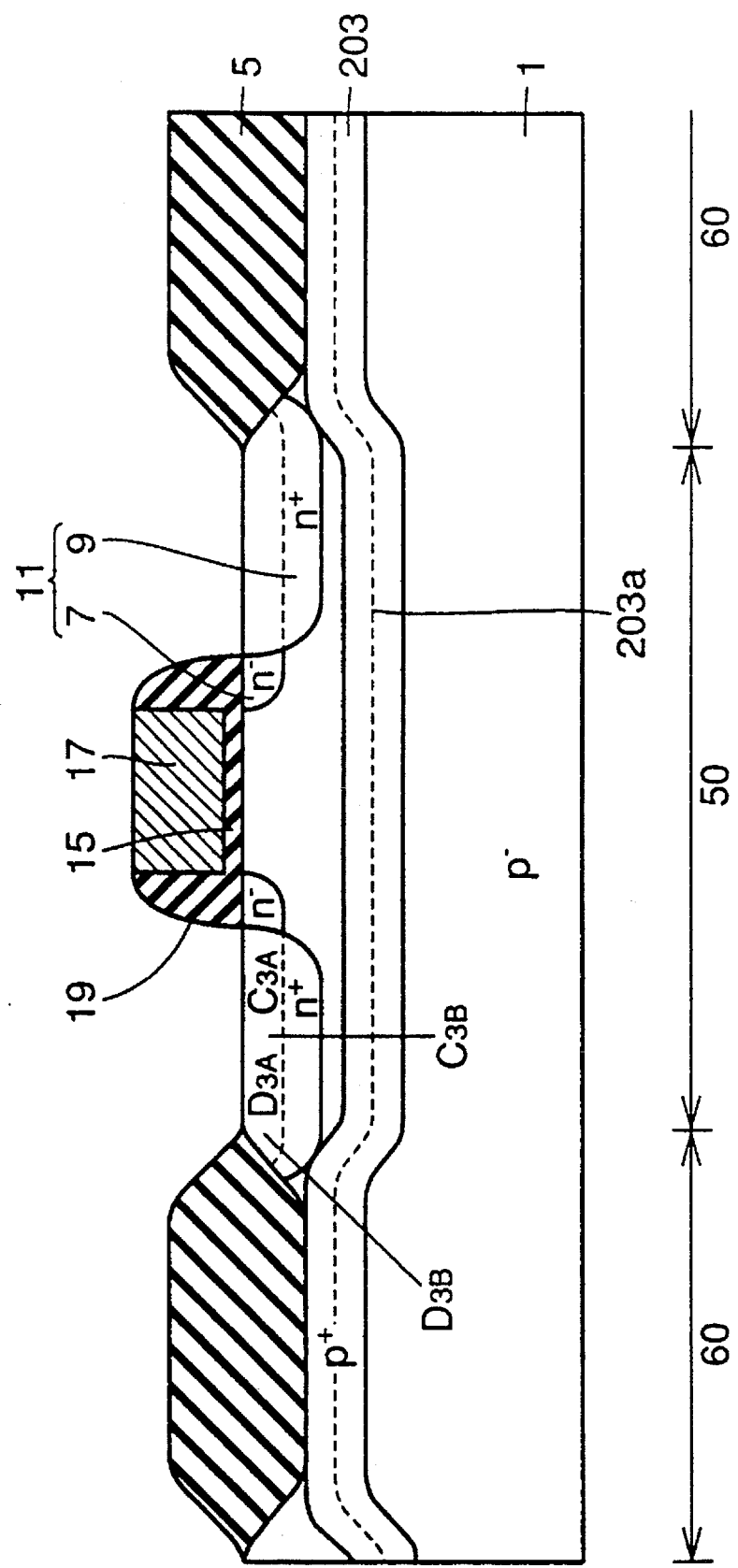
FIG. 19 is a schematic sectional view showing the construction of a semiconductor device in a modification of the present invention.
Figure 20:
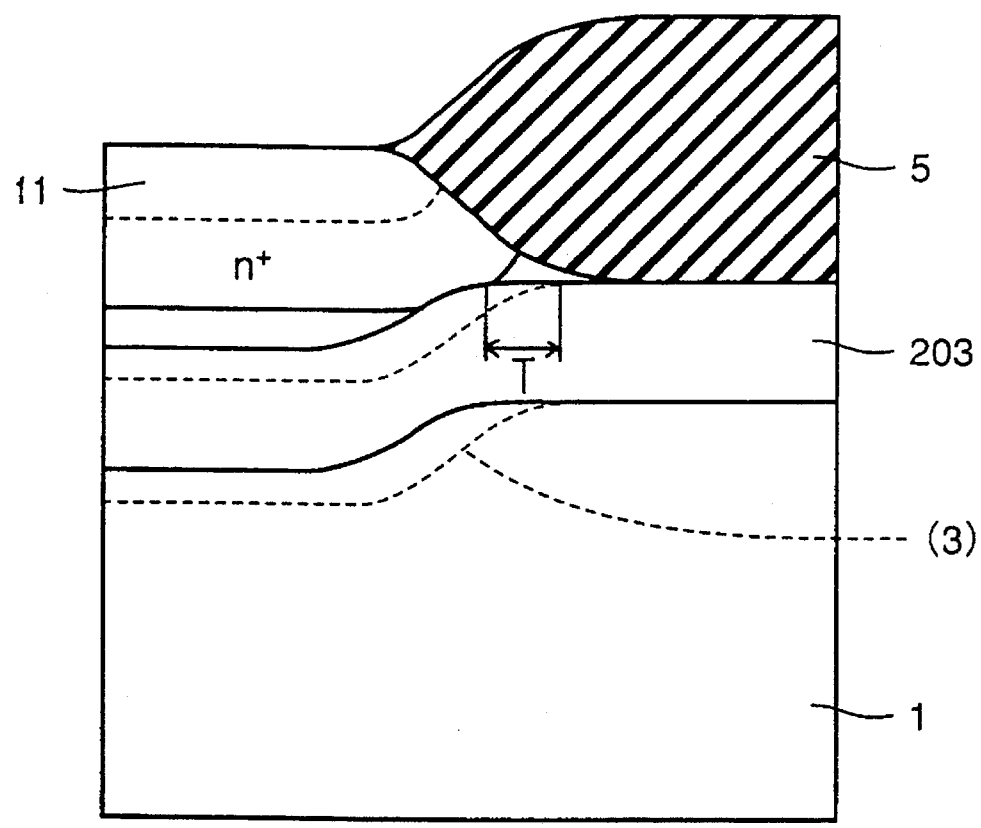
FIG. 20 is an enlarged sectional view showing the construction near the side end portion of the isolating oxide film of FIG. 19.

Referring to FIGS. 19 and 20, this modification is different from the prior art semiconductor device shown in FIG. 24 in that the p⁺ impurity diffusion region 3 is replaced with a p⁺ impurity diffusion region 203.

Referring to FIG. 20, in this modification, the p⁺ impurity diffusion region 203 is formed in such a manner as to be shallower than the p⁺ impurity diffusion region 3 in the prior art within the element formation region. Moreover, as compared with the p⁺ impurity diffusion region 3 in the prior art, the p⁺ impurity diffusion region 203 in this modification is formed in such a manner as to be kept at the same depth as that of a region contacted with the isolating oxide film 5 by a length T from the lower surface of the isolating oxide film 5 to the element forming region.

Figure 21:
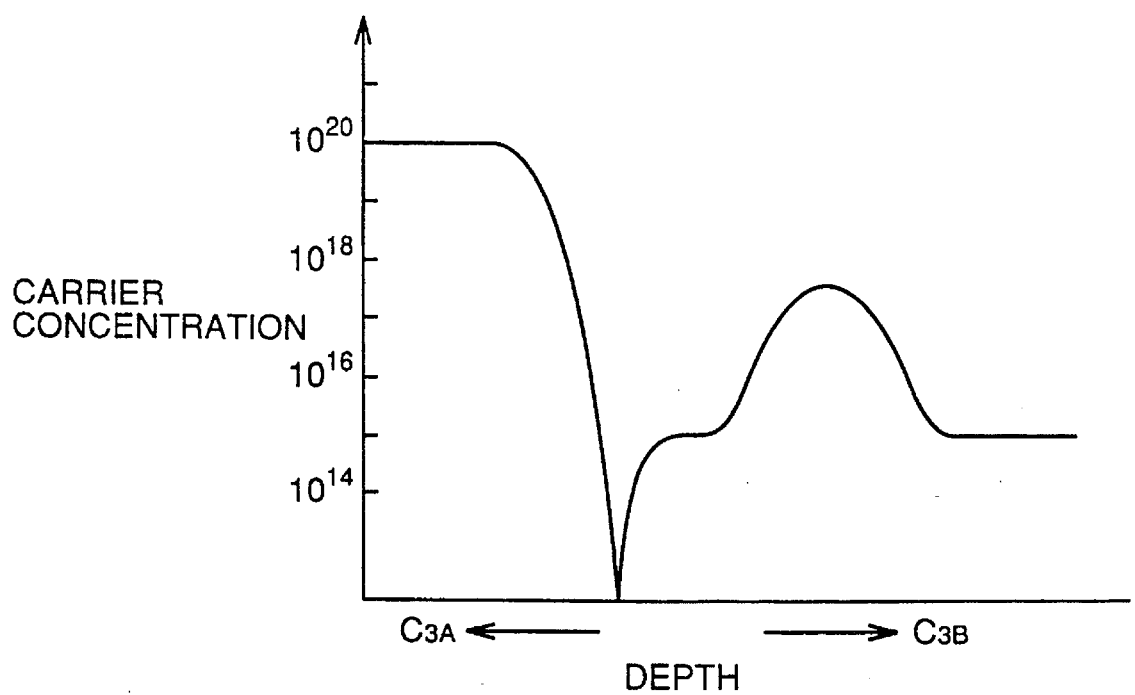
FIG. 21 is a diagram showing a change in carrier concentration relative to a change in depth along line $C_{3A}$–$C_{3B}$ of FIG. 19.
Figure 22:
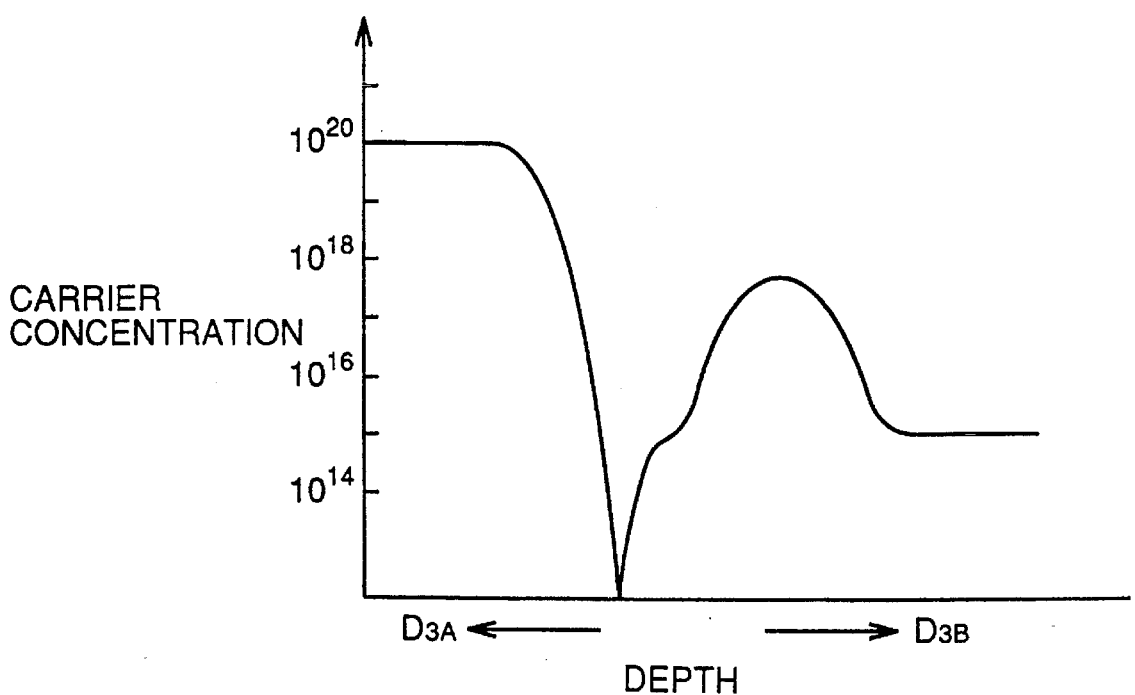
FIG. 22 is a diagram showing a change in carrier concentration relate to a change in depth along line $D_{3A}$–$D_{3B}$ of FIG. 19.

Referring to FIGS. 21, 22, the p-type impurity concentration of the p⁺ impurity diffusion region 203 is in the range of from $1 \times 10^{17}$ cm⁻³ to $1 \times 10^{18}$ cm⁻³. In particular, the p⁺ impurity diffusion region 203 is adjacent to the n-type source/drain region 11 near the side end portion of the isolating oxide film 5.

The fabricating method in this modification will be described below.

Figure 23:
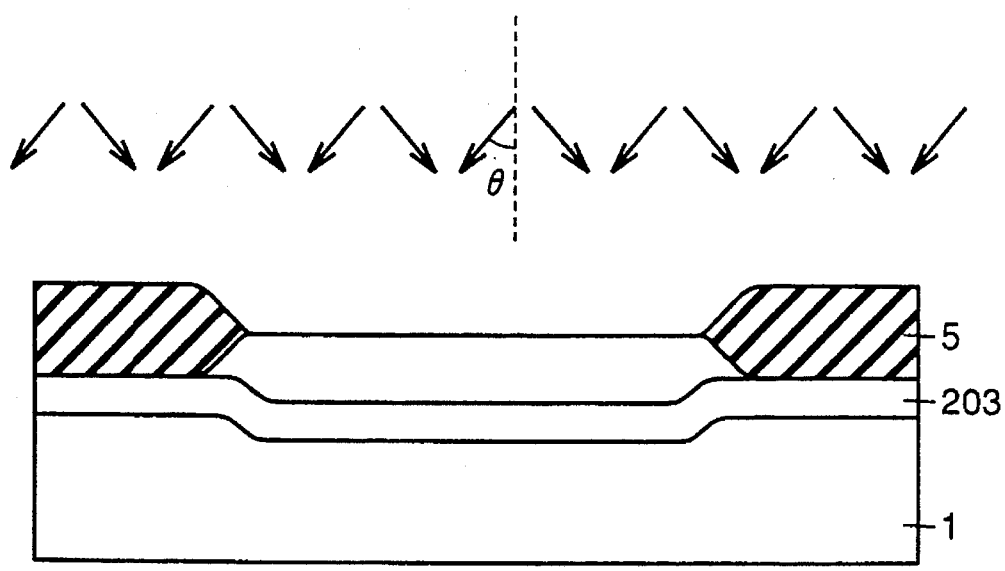
FIG. 23 is a schematic sectional view showing one process of fabricating the semiconductor device in the modification of the present invention.
Figure 27:
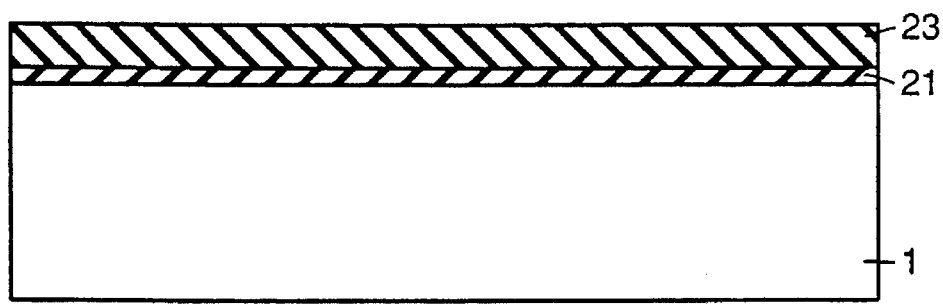
FIGS. 27 to 34 are schematic sectional views showing processes of fabricating a semiconductor device in the prior art in sequence.
Figure 28:
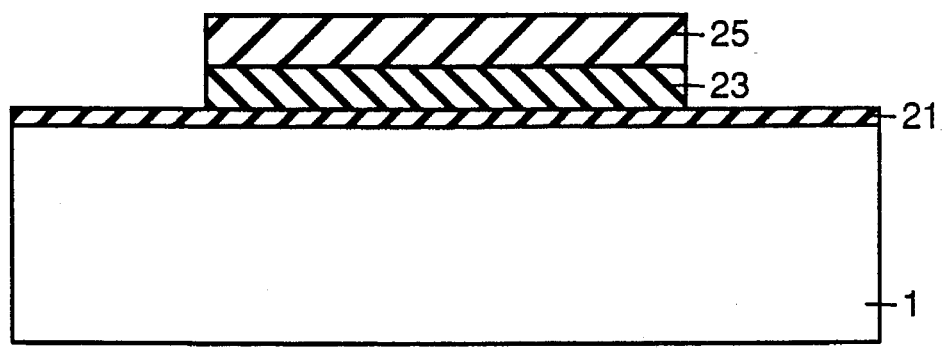
Figure 29:
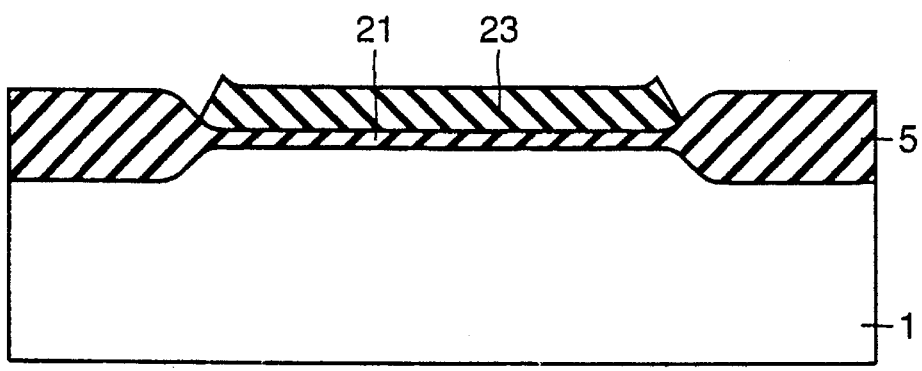
Figure 30:
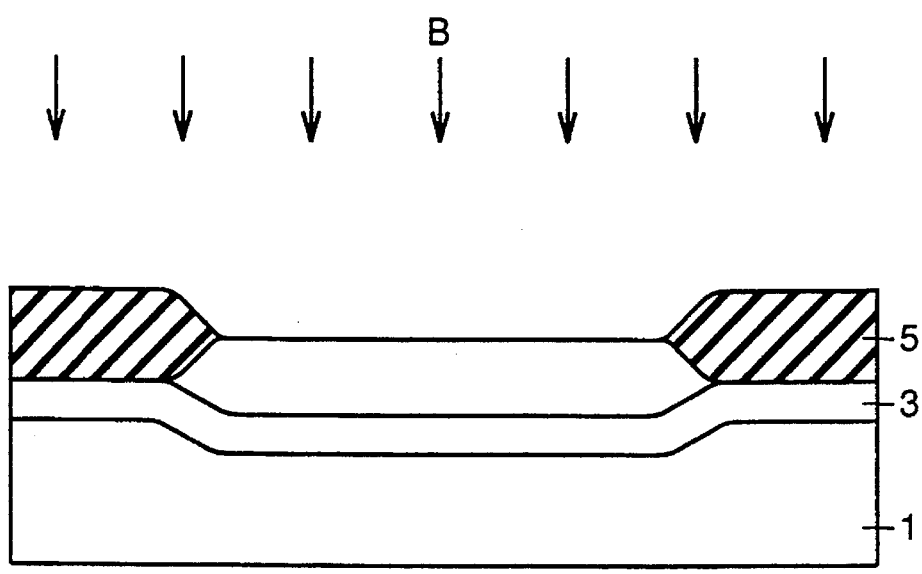
Figure 31:
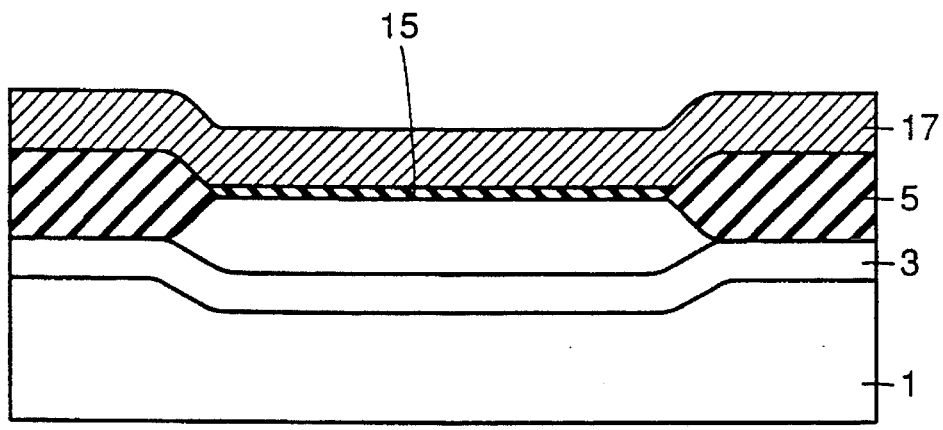
Figure 32:
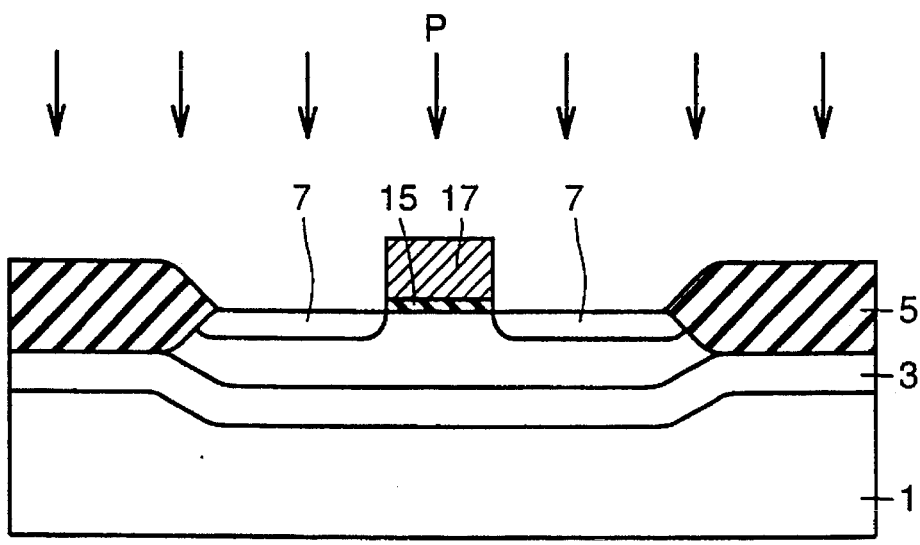
Figure 33:
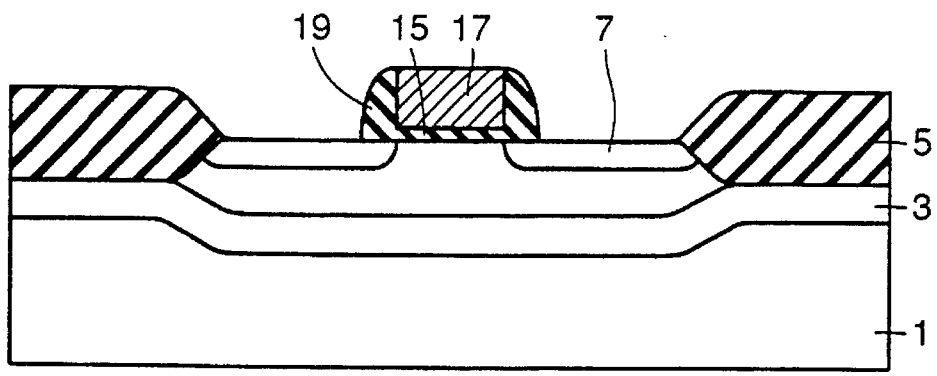
Figure 34:
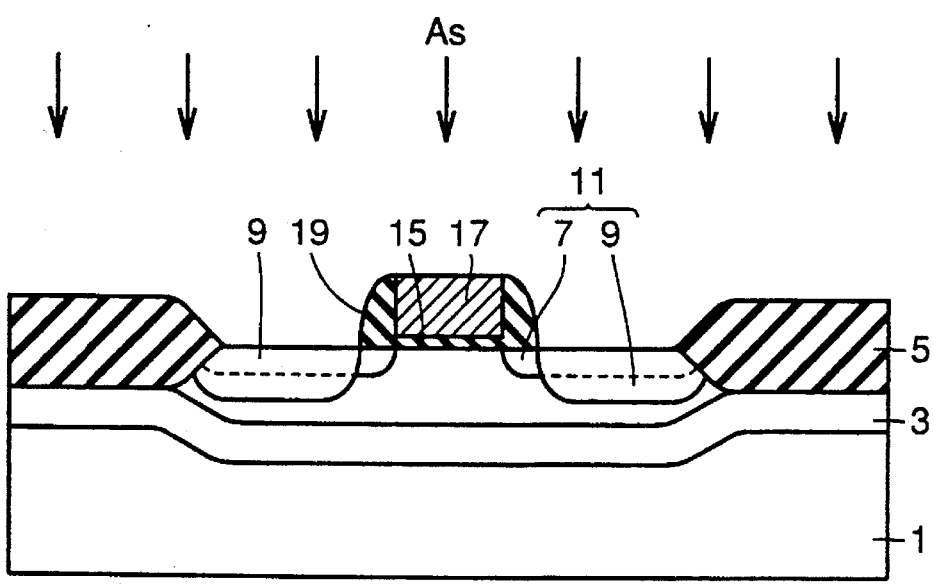
Figure 35:
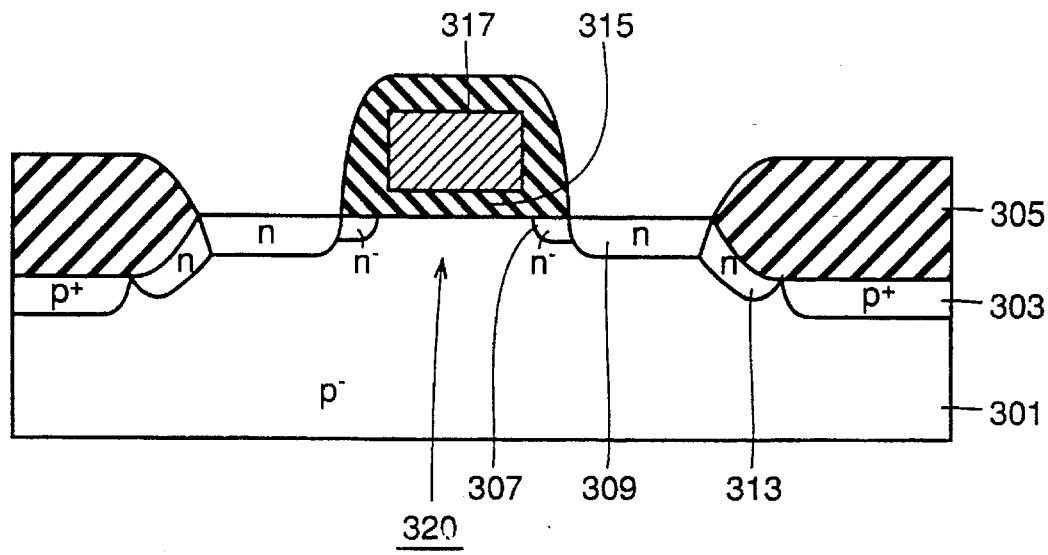
FIG. 35 is a sectional view showing the construction of a semiconductor device disclosed in Japanese Patent Publication.
Figure 36:
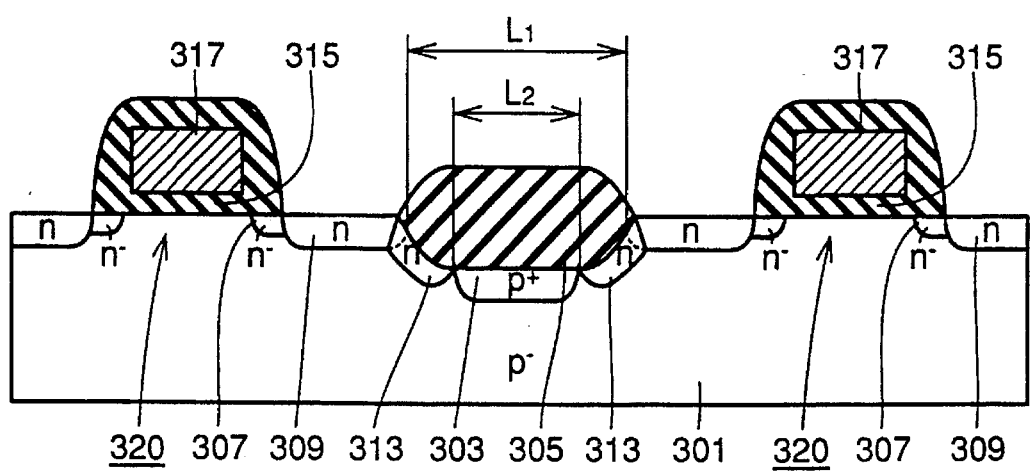
FIG. 36 is a schematic sectional view showing the construction in which a plurality of the semiconductor devices shown in FIG. 35 are formed.

First, the fabricating method in this modification goes through processes shown in FIGS. 27 to 29. After that, referring to FIG. 23, ions of boron (B) are implanted in the whole surface of the p⁻ silicon substrate 1 in a dose of from $1 \times 10^{13}$ cm⁻² to $5 \times 10^{13}$ cm⁻² at an accelerating voltage of 100 to 180 keV by oblique rotation type ion implantation. The implanting angle θ in this oblique rotation type ion implantation is in the range of from 30° to 60° relative to the normal line perpendicular to the surface of the p⁻ silicon substrate 1.

After that, the fabricating method goes through a series of processes shown in FIGS. 31 to 34, to thus fabricate a semiconductor device shown in FIG. 19.

In this modification, since the p⁺ impurity diffusion region 203 is formed by the above-described oblique rotation type ion implantation, the p⁺ impurity diffusion region 203 is adjacent to the n-type source/drain region 11 at the side end portion of the isolating oxide film 5. Accordingly, the extension of a depletion layer at the pn-junction constituted of the n-type source/drain region and the p-type silicon substrate 1 is suppressed, thus reducing the generation of leakage current caused by the crystal defects entrapped in the depletion layer.

In Embodiments 1 and 3, the p⁺ impurity diffusion region 3 is formed by a common ion implantation; however, as described in the modification, it may be formed by oblique rotation type ion implantation. In this case, the p⁺ impurity diffusion region 203 is close to the n-type source/drain region 11 at the side end portion of the isolating oxide film 5, so that the generation of leakage current can be further reduced.

Although in the embodiments and modification, the MOS transistor using a silicon oxide film as a gate insulating film has been described, the gate insulating film may be formed of the other insulating film.

In the semiconductor device of the present invention, the third impurity region is contacted with the second impurity region for forming a source/drain region of a MOS transistor at the side end portion of the isolating/insulating film. The third impurity region has an impurity concentration higher than that of the semiconductor substrate. Accordingly it becomes possible to suppress the extension of a depletion layer at the pn-junction constituted of the third impurity region and the second impurity region, and hence to reduce the generation of leakage current.

The third impurity region has the conducting type reversed to that of the second impurity region for forming a source/drain region of a MOS transistor, so that the area of the pn-junction between the source/drain region of a MOS transistor and the semiconductor substrate is not enlarged and thereby the capacitance of the pn-junction is not increased. The high speed circuit operation can be thus kept.

Moreover, even when the third impurity region is provided, a gap between the second impurity regions for forming the source/drain regions of the adjacent MOS transistors is not made narrow, so that the electrically isolating ability between the adjacent MOS transistors can be enhanced.

In the method of a semiconductor device according to the present invention, there can be fabricated a semiconductor device capable of reducing the generation of leakage current due to crystal defects, suppressing the delay of circuit operation, and enhancing the electrically isolating ability.

In a preferred mode of the fabricating method, since the first impurity region is formed by oblique rotation type implantation, the first impurity region and the second impurity region are formed to be close to each other near the side end portion of the isolating/insulating film. The first impurity region has a concentration of an impurity of the first conducting type higher than that of the third impurity region, and accordingly, the generation of leakage current due to the distribution of crystal defects in the depletion layer can be further suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate of a first conducting type, which has a main surface, and which is doped with an impurity of the first conducting type at a first concentration;

a field oxide region for isolating an active region formed on the main surface of said semiconductor substrate to isolate an element forming region;

a first impurity region of the first conducting type, which is doped with an impurity of the first conducting type at a second concentration higher than said first concentration, which first impurity region is in contact with the lower surface of said field oxide region within said semiconductor substrate;

a second impurity region of a second conducting type formed at the main surface of said semiconductor substrate within said element forming region adjacent to said field oxide region; and a third impurity region of the first conducting type, which is doped with an impurity of the first conducting type in a third concentration higher than said first concentration and lower than said second concentration, and which is formed within said semiconductor substrate and only between said first impurity region and said second impurity region along said field oxide region and in contact with said second impurity region.

2. A semiconductor device according to claim 1, wherein said first impurity region extends within said semiconductor substrate from a position in contact with the lower surface of said field oxide region to a position at a specified depth within said element forming region, and which has an impurity concentration peak of the first conducting type.

3. A semiconductor device according to claim 1, wherein said third impurity region extends along the lower surface of said second impurity region.

4. A semiconductor device according to claim 1, wherein an MIS transistor having a pair of source/drain regions are further formed at the main surface of said semiconductor substrate, and said second impurity region is said source/drain region of said MIS transistor.

5. A semiconductor device according to claim 1, wherein said first concentration is substantially $1 \times 10^{15}$ cm$^{-3}$; said second concentration is in the range of from $1 \times 10^{17}$ cm$^{-3}$ to $1 \times 10^{18}$ cm$^{-3}$; and said third concentration is in the range of from $1 \times 10^{16}$ cm$^{-3}$ to $1 \times 10^{17}$ cm$^{-3}$.

6. A semiconductor device according to claim 1, wherein said second impurity region has an LDD structure composed of an impurity region doped with an impurity at a relatively low concentration and an impurity region doped with the impurity at a relatively high concentration.

7. A semiconductor device comprising:

a semiconductor substrate of a first conducting type, which has a main surface, and which is doped with an impurity of the first conducting type at a first concentration;

a field oxide region for isolating an active region formed on the main surface of said semiconductor substrate to isolate an element forming region, which element forming region comprises a channel region;

a first impurity region of the first conducting type, which is doped with an impurity of the first conducting type at a second concentration higher than said first concentration, which first impurity region is in contact with the lower surface of said field oxide region within said semiconductor substrate;

a second impurity region of a second conducting type formed at the main surface of said semiconductor substrate within said element forming region adjacent to said field oxide region; and a third impurity region of the first conducting type, which is doped with an impurity of the first conducting type in a third concentration higher than said first concentration and lower than said second concentration, and which is formed within said semiconductor substrate and only between said first impurity region and said second impurity region along said field oxide region and in contact with said second impurity region but not extending into the channel region.

\* \* \* \* \*